United States Patent [19]

Okamoto et al.

[11] Patent Number: 5,049,481
[45] Date of Patent: Sep. 17, 1991

[54] SENSITIZERS FOR PHOTOPOLYMERIZABLE COMPOSITIONS

[75] Inventors: Yasuo Okamoto; Tadahiro Sorori, both of Shizuoka, Japan

[73] Assignee: Fuji Photo Film Co., Ltd., Ashigara, Japan

[21] Appl. No.: 456,968

[22] Filed: Dec. 26, 1989

[30] Foreign Application Priority Data

Dec. 29, 1988 [JP] Japan ................ 63-335219

[51] Int. Cl.$^5$ .............. G03F 7/028; G03F 7/029; G03F 7/031
[52] U.S. Cl. ............................. 430/283; 430/920; 430/922; 430/926; 430/915; 430/914; 430/281; 430/284; 430/288; 430/945; 522/13; 522/14; 522/16; 522/17; 522/18; 522/23; 522/2; 522/913; 522/15; 522/9
[58] Field of Search ............ 430/920, 922, 926, 915, 430/914, 281, 283, 284, 288, 945; 522/15, 9, 13, 14, 16, 17, 18, 23, 2, 913

[56] References Cited

U.S. PATENT DOCUMENTS

| | | | |
|---|---|---|---|
| 3,563,749 | 2/1971 | Munder et al. | 430/922 X |
| 4,062,686 | 12/1977 | Van Allan et al. | 430/281 |
| 4,148,658 | 4/1979 | Kondoh et al. | 430/288 X |
| 4,239,850 | 12/1980 | Kita et al. | 522/14 X |
| 4,258,123 | 3/1981 | Nagashima et al. | 522/16 X |
| 4,282,309 | 8/1981 | Laridon et al. | 522/18 X |
| 4,399,211 | 8/1983 | Kondo et al. | 430/281 X |
| 4,481,276 | 11/1984 | Ishikawa et al. | 430/281 |

FOREIGN PATENT DOCUMENTS 0300410 1/1989 European Pat. Off. .

Primary Examiner—Cynthia Hamilton
Attorney, Agent, or Firm—Burns, Doane, Swecker & Mathis

[57] ABSTRACT

A photopolymerizable composition comprising (i) a polymerizable compound having an addition polymerizable unsaturated bond, (ii) a compound represented by formula (Ia):

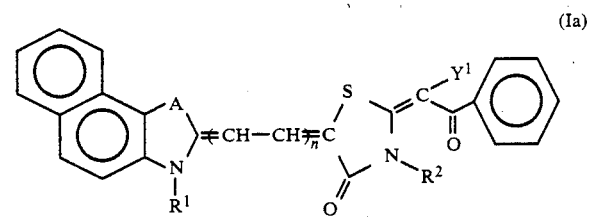

a compound represented by formula (Ib):

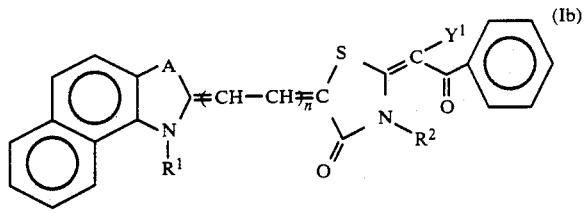

or a compound represented by formula (Ic):

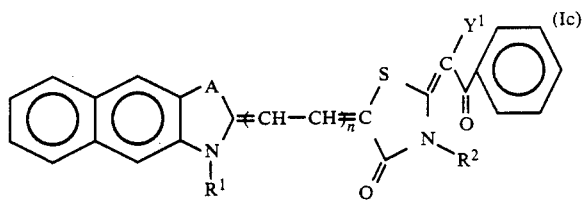

wherein A represents an oxygen atom, a sulfur atom, a selenium atom, a tellurium atom, an alkyl- or aryl-substituted nitrogen atom, or a dialkyl-substituted carbon atom; $Y^1$ represents a hydrogen atom, an alkyl group, a substituted alkyl group, an aryl group, a substituted aryl group, an aralkyl group, an acyl group, an alkoxycarbonyl group, or a substituted alkoxycarbonyl group; $R^1$ and $R^2$ each represents a hydrogen atom, an alkyl group having from 1 to 18 carbon atoms, or an alkyl group having from 1 to 18 carbon atoms which is substituted with $R^3O—$,

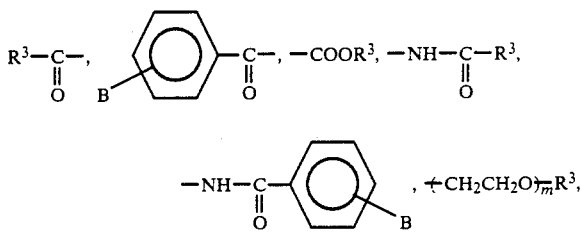

or a halogen atom (i.e., F, Cl, Br, and I), wherein $R^3$ represents a hydrogen atom or an alkyl group having from 1 to 10 carbon atoms, and B represents a dialkylamino group, a hydroxyl group, an acyloxy group, a halogen atom, or a nitro group; n represents 0 or an integer of from 1 to 4; and m represents an integer of from 1 to 20, and (iii) at least one compound selected from the group consisting of (a) a compound having a carbon-halogen bond, (b) an aromatic onium salt, (c) an organic peroxide, (d) a thio compound represented by formula (II):

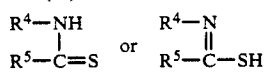

wherein $R^4$ represents an alkyl group, an aryl group, or a substituted aryl group; and $R^5$ represents a hydrogen atom or an alkyl group; or $R^4$ and $R^5$ are taken together to represent a non-metallic atom group necessary to form a 5- to 7-membered ring which may contain a hetero atom selected from oxygen, sulfur and nitrogen atoms, (e) a hexaarylbiimidazole, and (f) a ketoxime ester. The composition has high sensitivity in a broadened range of light from the ultraviolet region to the visible region.

22 Claims, No Drawings

5,049,481

SENSITIZERS FOR PHOTOPOLYMERIZABLE COMPOSITIONS

FIELD OF THE INVENTION

This invention relates to a photopolymerizable composition. More particularly, it relates to a photopolymerizable composition containing a polymerizable compound having an addition polymerizable unsaturated bond, a photopolymerization initiator system having a novel composition and, if desired, a linear organic high polymer. The photopolymerizable composition is sensitive to, for example, an argon laser beam and useful as a photosensitive layer of a presensitized printing plate precursor, etc.

BACKGROUND OF THE INVENTION

It is a well-known technique to reproduce an image by photographic procedures using a photosensitive composition comprising a polymerizable compound having an addition polymerizable unsaturated bond, a photopolymerization initiator and, if desired, an appropriate film-forming binder and a thermal polymerization inhibitor. A photosensitive composition of this type undergoes photopolymerization on exposure to light to be cured and insolubilized as described, e.g., in U.S. Pat. Nos. 2,927,022, 2,902,356, and 3,870,524. Light exposure of the photosensitive composition in a film form through a desired negative followed by removal of the unexposed area with an appropriate solvent (hereinafter referred to as development) gives a desired cured image of the polymerized composition. Thus, the photopolymerizable composition of this type is extremely useful for the production of printing plates and the like.

Since a polymerizable compound having an addition polymerizable unsaturated bond, when used alone, does not exhibit sufficient photosensitivity, it has been proposed to use a photopolymerization initiator in combination to improve photosensitivity. Conventionally employed photopolymerization initiators include benzil, benzoin, benzoin ethyl ether, Michler's ketone, anthraquinone, acridine, phenazine, benzophenone, and 2-ethylanthraquinone, etc. However, photopolymerizable compositions using these photopolymerization initiators have low response on curing and therefore require a long time for imagewise exposure for image formation. For this reason, if a vibration, even slight, takes place during exposure, a minute image cannot be precisely reproduced. Further, consideration should be given to dissipation of a large quantity of heat accompanying the increased energy emitted from a light source for exposure. In addition, the heat generated tends to cause deformation or denaturation of the photosensitive film.

Moreover, the conventional photopolymerization initiators are considerably less capable of photopolymerization with light in the visible region of 400 nm or more as compared with their ability with light in the ultraviolet region of 400 nm or less. Therefore, photopolymerizable compositions containing the conventional photopolymerization initiators have been of very narrow application.

Several proposals with respect to photopolymerizable systems sensitive to visible light have hitherto been made. For example, U.S. Pat. No. 2,850,445 reports that a certain kind of photoreducing dyes, such as Rose Bengale, Eosine, and Erythrocin, exhibit effective sensitivity to visible light. Also included in improved techniques are a dye/amine complex initiator system (JP-B-44-20189, the term "JP-B" as used herein means an "examined published Japanese patent publication"), a hexaarylbiimidazole/radical generator/dye system (JP-B-45-37377), a hexaarylbiimidazole/p-dialkylaminobenzylidene ketone system (JP-B-47-2528, JP-A-54-155292, the term "JP-A" as used herein means an "unexamined published Japanese patent application"), a 3-keto-substituted coumarin compound/active halogen compound system (JP-A-58-15503), and a substituted triazine/merocyanine dye system (JP-A-54-15102). These techniques proposed are certainly effective with respect to the photopolymerization rate to visible light to some extent, but are still not satisfactory, and a further improvement has been demanded.

On the other hand, studies having been recently directed to increase in sensitivity to ultraviolet light and image formation using a laser beam, UV projection exposure, laser direct plate making, laser facsimiles, holography, etc. have already been put into practical use. In order to cope with these latest techniques, photosensitive materials having high sensitivity have now been under development, but sufficient sensitivity has not yet been reached.

SUMMARY OF THE INVENTION

An object of this invention is to provide a highly sensitive photopolymerizable composition.

The object is to provide a photopolymerizable composition comprising a widespread polymerizable compound having an addition polymerizable unsaturated bond and a photopolymerization initiator capable of increasing the photopolymerization rate of the polymerizable compound.

Another object of this invention is to provide a photopolymerizable composition containing a photopolymerization initiator exhibiting high sensitivity not only to ultraviolet light but to visible light of 400 nm or more, particularly light of about 488 nm corresponding to the output of an argon laser.

The inventors have conducted extensive investigations and, as a result, have found that a specific photopolymerization initiator system markedly increases a photopolymerization rate of a polymerizable compound having an addition polymerizable unsaturated bond and also exhibits high sensitivity to visible light of 400 nm or more, and thus reached the present invention.

The present invention provides a photopolymerizable composition comprising (i) a polymerizable compound having an addition polymerizable unsaturated bond, (ii) a compound represented by formula (Ia):

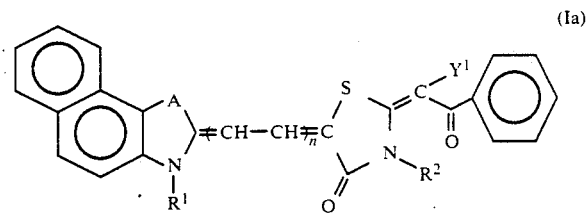

a compound represented by formula (Ib):

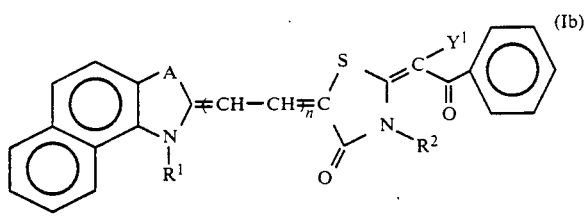

or a compound represented by formula (Ic):

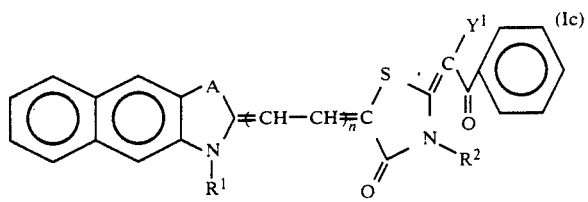

wherein A represents an oxygen atom, a sulfur atom, a selenium atom, a tellurium atom, an alkyl- or aryl-substituted nitrogen atom, or a dialkyl-substituted carbon atom; $Y^1$ represents a hydrogen atom, an alkyl group, a substituted alkyl group, an aryl group, a substituted aryl group, an aralkyl group, an acyl group, an alkoxycarbonyl group, or a substituted alkoxycarbonyl group; $R^1$ and $R^2$ each represents a hydrogen atom, an alkyl group having from 1 to 18 carbon atoms, or an alkyl group having from 1 to 18 carbon atoms which is substituted with $R^3$—,

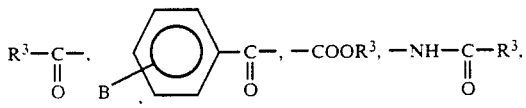

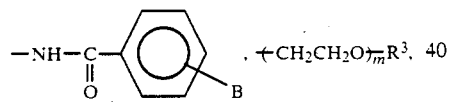

or a halogen atom (i.e., F, Cl, Br, and I), wherein $R^3$ represents a hydrogen atom or an alkyl group having from 1 to 10 carbon atoms, and B represents a dialkylamino group, a hydroxyl group, an acyloxy group, a halogen atom, or a nitro group; n represents 0 or an integer of from 1 to 4; and m represents an integer of from 1 to 20, and (iii) at least one compound selected from the group consisting of (a) a compound having a carbon-halogen bond, (b) an aromatic onium salt, (c) an organic peroxide, (d) thio compounds represented by formula (II) below which are tautomers:

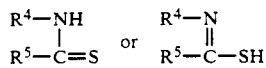

wherein $R^4$ represents an alkyl group, an aryl group, or a unsubstituted aryl group; and $R^5$ represents a hydrogen atom or an alkyl group; or $R^4$ and $R^5$ are taken together to represent a nonmetallic atom group necessary to form a 5- to 7-membered ring which may contain a hetero atom selected from oxygen, sulfur and nitrogen atoms, (e) a hexaarylbiimidazole, and (f) a ketoxime ester.

The photosensitivity of the above-described photopolymerizable composition can further be improved by incorporating into the composition (iv) a compound represented by formula (III):

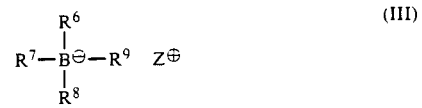

wherein $R^6$, $R^7$, $R^8$, and $R^9$, which may be the same or different, each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group; or two or more of $R^6$, $R^7$, $R^8$, and $R^9$ are taken together to form a cyclic structure, provided that at least one of $R^6$, $R^7$, $R^8$, and $R^9$ is an alkyl group; and $Z^\oplus$ represents an alkali metal cation or a quaternary ammonium cation, and/or (v) a compound represented by formula (IV):

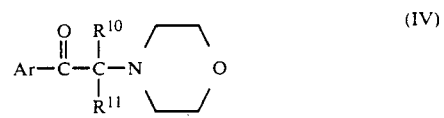

wherein Ar represents an aromatic group represented by formula:

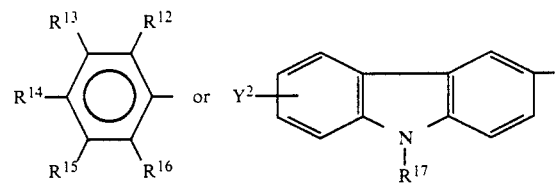

wherein $R^{12}$, $R^{13}$, $R^{14}$, $R^{15}$, and $R^{16}$, which may be the same or different, each represents a hydrogen atom, a halogen atom, an alkyl group, an alkenyl group, an aryl group, a substituted aryl group, a hydroxyl group, an alkoxyl group, a substituted alkoxyl group, —S—$R^{18}$, —SO—$R^{18}$, or —SO$_2R^{18}$, wherein $R^{18}$ represents an alkyl group or an alkenyl group, provided that at least one of $R^{12}$, $R^{13}$, $R^{14}$, $R^{15}$, and $R^{16}$ is —S—$R^{18}$, —SO—$R^{18}$, or —SO$_2R^{18}$; $R^{17}$ represents a hydrogen atom, an alkyl group, or an acyl group; and $Y^2$ represents a hydrogen atom or

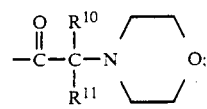

and $R^{10}$ and $R^{11}$ each represents a hydrogen atom or an alkyl group, or $R^{10}$ and $R^{11}$ are taken together to form an alkylene group.

DETAILED DESCRIPTION OF THE INVENTION

The polymerizable compound having an addition polymerizable unsaturated bond as component (i) is selected from compounds having at least one, preferably two or more of terminal ethylenically unsaturated bonds. Such compounds may have a chemical form of a monomer, a prepolymer including a dimer, a trimer and an oligomer, or a mixture thereof or a copolymer thereof. Examples of monomers (inclusive of copolymers thereof) include esters of unsaturated carboxylic acids (e.g., acrylic acid, methacrylic acid, itaconic acid, crotonic acid, isocrotonic acid, and maleic acid) and aliphatic polyhydric alcohols and amides of unsaturated carboxylic acids and aliphatic polyamine compounds.

Specific examples of the esters of aliphatic polyhydric alcohols and unsaturated carboxylic acids are acrylic esters, e.g., ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetramethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomers; methacrylic esters, e.g., tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritoldimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis-[p-(acryloxyethoxy)phenyl]dimethylmethane; itaconic esters, e.g., ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate; crotonic esters, e.g., ethylene glycol dicrotonate, tetramethylene glycol dicrotonate, pentaerythritol dicrotonate, and sorbitol tetradicrotonate; isocrotonic esters, e.g., ethylene glycol diisocrotonate, pentaerythritol diisocrotonate, and sorbitol tetraisocrotonate; maleic esters, e.g., ethylene glycol dimaleate, triethylene glycol dimaleate, pentaerythritol dimaleate, and sorbitol tetramaleate; and mixtures of these ester monomers.

Specific examples of the amides of aliphatic polyamine compounds and unsaturated carboxylic acids are methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide.

Component (i) additionally includes vinylurethane compounds containing at least two polymerizable vinyl groups per molecule which are obtained by adding a hydroxyl-containing vinyl monomer represented by formula (A):

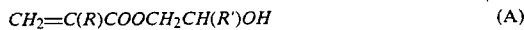

$$CH_2=C(R)COOCH_2CH(R')OH \qquad (A)$$

wherein R and R' each represents a hydrogen atom or a methyl group, to a polyisocyanate compound having at least two isocyanate groups per molecule, as described in JP-B-48-41708.

Further included in component (i) are polyfunctional acrylates or methacrylates, such as urethane acrylates as described in JP-A-51-37193; polyester acrylates as described in JP-A-48-64183, JP-B-49-43191, and JP-B-52-30490; and epoxy acrylates obtained by reacting an epoxy resin with (meth)acrylic acid. The photo-curable monomers and oligomers disclosed in *Nippon Secchaku Kyokaishi (Journal of The Adhesion Society of Japan)*, Vol. 20, No. 7, pp. 300–308 (1984) are also employable as component (i).

Component (i) is used in an amount usually of from 5 to 50% by weight, and preferably from 10 to 40% by weight based on the total components.

Component (ii) is at least one selected from the compounds represented by formulae (Ia), (Ib) and (Ic) shown above.

In formulae (Ia) to (Ic), the alkyl group as represented by $Y^1$ includes straight chain, branched, or cyclic alkyl groups having from 1 to 18 carbon atoms. Specific examples are methyl, ethyl, propyl, butyl, pentyl, hexyl, heptyl, octyl, nonyl, decyl, dodecyl, octadecyl, isopropyl, isobutyl, isopentyl, isohexyl, sec-butyl, neopentyl, t-butyl, t-pentyl, cyclopentyl, cyclohexyl, cycloheptyl, and 2-norbornyl groups. Preferred of them are straight chain or branched alkyl groups having from 1 to 10 carbon atoms and cyclic alkyl groups having from 6 to 10 carbon atoms. The most preferred are straight chain or branched alkyl groups having from 1 to 4 carbon atoms.

Substituents of the substituted alkyl group as represented by $Y^1$ include a halogen atom (i.e., fluorine, chlorine, bromine, and iodine atoms) and a hydroxyl group. The alkyl moiety of the substituted alkyl group includes the above-recited alkyl groups having from 1 to 18 carbon atoms, preferably straight chain or branched alkyl groups having from 1 to 10 carbon atoms and cyclic alkyl groups having from 6 to 10 carbon atoms, and more preferably straight chain or branched alkyl groups having from 1 to 4 carbon atoms. Specific examples of the substituted alkyl group are chloromethyl, bromomethyl, 2-chloroethyl, 2,2,2-trichloroethyl, 2-chloropentyl, 1-(chloromethyl)propyl, 10-bromodecyl, 18-methyloctadecyl, chlorocyclohexyl, hydroxymethyl, 2-hydroxyethyl, 2-hydroxybutyl, 5-hydroxypentyl, 10-hydroxydecyl, 2-hydroxyoctadecyl, 2-(hydroxymethyl)ethyl, hydroxycyclohexyl, and 3-hydroxy-2-norbornyl groups.

The aryl group as represented by $Y^1$ includes a residue of a monobenzene ring (i.e., phenyl), a residue of two or three condensed benzene rings (e.g., naphthyl, anthryl, phenanthryl), a residue of two benzene rings connected via a bond (i.e., biphenyl), and a residue of a benzene ring condensed with a 5-membered unsaturated ring (e.g., indenyl, acenaphthenyl, fluorenyl).

The substituted aryl group as represented by $Y^1$ includes the above-enumerated aryl groups whose ring-forming carbon atom(s) is/are substituted with one or two or more, which may be the same or different, of substituents, such as a halogen atom (e.g., fluorine, chlorine, bromine and iodine atoms), an amino group, a substituted amino group [e.g., a monoalkyamino group (the alkyl group includes methyl, ethyl, propyl, pentyl, isopropyl, sec-butyl, and isopentyl groups), a dialkyl-substituted amino group (the alkyl group includes the same examples as described above), and a monoacylamino group (the acyl group includes acetyl, propionyl, butyryl, isobutyryl, and valeryl groups)], a cyano group, a straight chain, branched or cyclic alkyl group having up to 18 carbon atoms (preferably, a straight chain, branched or cyclic alkyl group having up to 10 carbon atoms, and more preferably a straight or branched alkyl group having from 1 to 4 carbon atoms;

specific examples of these alkyl groups have previously been described), a halogenoalkyl group (e.g., chloromethyl, 2-chloroethyl, 5-chloropentyl, trifluoromethyl), an alkoxyl group (e.g., methoxy, ethoxy, butoxy, pentoxy, isopropoxy, isopentoxy, 2-methylbutoxy, and sec-butoxy), an aryloxy group (e.g., phenoxy, 1-naphthoxy, 2-naphthoxy), an alkoxycarbonyl group (e.g., methoxycarbonyl, ethoxycarbonyl, propoxycarbonyl, isopropoxycarbonyl, butoxycarbonyl), an acyloxy group (examples of the acyl moiety are the same as those enumerated for the monoacylamino group), and an alkoxysulfonyl group (examples of the alkoxyl moiety are the same as those enumerated for the alkoxyl group). Specific examples of the substituted or unsubstituted aryl group are phenyl, chlorophenyl, aminophenyl, (methylamino)phenyl, (ethylamino)phenyl, (dimethylamino)phenyl, acetylaminophenyl, tolyl, ethylphenyl, ,:chloromethyl)phenyl, acetylphenyl, phenoxyphenyl, methoxycarbonylphenyl, ethoxycarbonylphenyl, acetoxyphenyl, methoxysulfonylphenyl, naphthyl, 2-amino-1-naphthyl, 1-dimethylamino-2-naphthyl, chloronaphthyl, methylnaphthyl, anthryl, phenanthryl, indenyl, biphenylyl, chlorobiphenylyl, aminobiphenylyl, methylbiphenylyl, and acenaphthenyl groups Preferred among them are a phenyl group and a phenyl group substituted with one or two or more, which may be the same or different, of the above-enumerated substituents.

The aralkyl group represented by $Y^1$ includes a straight chain, branched, or cyclic alkyl group having from 1 to 10 carbon atoms, preferably from 1 to 6 carbon atoms, which is substituted with a phenyl group or a naphthyl group. Specific examples of such an aralkyl group include benzyl, phenethyl, 3-phenylpropyl, 3-phenylhexyl, 10-phenyldecyl, 4-phenylcyclohexyl, 1-naphthylmethyl, 2-(1-naphthyl)ethyl, and 2- naphthylmethyl groups.

The unsubstituted or substituted alkoxycarbonyl group as represented by $Y^1$ includes a straight chain, branched, or cyclic alkyl group having up to 10 carbon atoms bonded to an oxycarbonyl group. Specific examples are methoxycarbonyl, ethoxycarbonyl, propoxycarbonyl, butoxycarbonyl, secbutoxycarbonyl, t-butoxycarbonyl, 2-dimethylaminoethoxycarbonyl, 2-methoxyethoxycarbonyl, and 2-cyanoethoxycarbonyl groups.

The compounds represented by formula (Ia), (Ib) or (Ic) can be synthesized according to the process described in *Bull. Soc. Chemie Belges*, Vol. 57, pp. 364–372 (1948) [Abstract: *Chemical Abstracts*, Vol. 44, Cols. 603–61d (1950)].

Specific examples of the compounds of formulae (Ia) to (Ic) are shown below for illustrative purposes only but not for limitation.

| No. | [structure] | $R^1$ | $R^2$ | $Y^1$ | n |
|---|---|---|---|---|---|
| (ii)-1 | [naphthalene fused oxazoline, A] | CH$_3$ | CH$_3$ | H | 0 |
| (ii)-2 | [naphthalene fused thiazoline, S] | " | " | C$_2$H$_5$ | " | " |
| (ii)-3 | | " | $^n$C$_8$H$_{17}$ | " | " | " |
| (ii)-4 | | " | —CH$_2$CH$_2$O$^n$C$_4$H$_9$ | " | " | " |
| (ii)-5 | | " | " | $^n$C$_8$H$_{17}$ | " | " |
| (ii)-6 | | " | $^n$C$_8$H$_{17}$ | C$_2$H$_5$ | —C(=O)—C$_6$H$_5$ | " |
| (ii)-7 | | " | " | " | CH$_3$ | " |
| (ii)-8 | | " | " | " | —C$_6$H$_5$ | " |
| (ii)-9 | | " | " | " | H | 1 |
| (ii)-10 | [naphthalene fused oxazoline, O] | " | " | " | 0 |

-continued

| No. | | R¹ | R² | Y¹ | n |
|---|---|---|---|---|---|
| (ii)-11 | [naphtho-Se, N ring] | " | " | " | " |
| (ii)-12 | [naphtho-C(CH₃)₂, N ring] | " | " | " | " |
| (ii)-13 | [naphtho-N(ⁿC₈H₁₇), N ring] | " | " | " | " |
| (ii)-14 | [naphtho-C(CH₃)₂, N ring] | " | " | " | 2 |

[General structure: naphtho-A, N ring]

| No. | | R¹ | R² | Y¹ | n |
|---|---|---|---|---|---|
| (ii)-15 | [naphtho-S, N ring] | ⁿC₈H₁₇ | C₂H₅ | H | 0 |
| (ii)-16 | " | " | " | CH₃ | " |
| (ii)-17 | [naphtho-C(CH₃)₂, N ring] | —CH₂CH₂OCH₂CH₂OCH₃ | " | H | " |
| (ii)-18 | " | —CH₂CH₂—C(=O)—OC₂H₅ | " | " | " |
| (ii)-19 | [naphtho-Te, N ring] | —CH₂CH₂—NH—C(=O)—C₆H₅ | " | " | 1 |

| No. | | $R^1$ | $R^2$ | $Y^1$ | n |
|---|---|---|---|---|---|
| (ii)-20 | (naphtho-oxazole, A) | $^nC_8H_{17}$ | $C_2H_5$ | H | 0 |
| (ii)-21 | (naphtho-thiazole, S) | " | " | $CH_3$ | " |
| (ii)-22 | " | " | " | $-\underset{\underset{O}{\|\|}}{C}-C_6H_5$ | " |
| (ii)-23 | (naphtho-selenazole, Se) | " | " | $CH_3$ | 3 |
| (ii)-24 | (naphtho-oxazole, O) | " | " | $CH_3$ | 4 |

Component (iii) is selected from the group consisting of (a) a compound having a carbon-halogen bond, (b) an aromatic onium salt, (c) an organic peroxide, (d) a thio compound represented by formula (II) shown above, (e) a hexaarylbiimidazole, and (f) a ketoxime ester.

Component (a) preferably includes compounds represented by formulae (V) to (XI):

Formula (V)

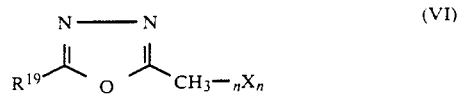

wherein X represents a halogen atom; Y represents $-CX_3$, $-NH_2$, $-NHR'$, $-NR'_2$, or $-OR'$, wherein R' represents a substituted or unsubstituted alkyl group, a substituted or unsubstituted aryl group; and R represents $-CX_3$, a substituted or unsubstituted alkyl group, a substituted or unsubstituted aryl group, or a substituted alkenyl group;

Formula (VI)

$$R^{19}-\underset{N=N}{\underset{\|}{C}}-O-\underset{\|}{C}-CH_{3-n}X_n \qquad (VI)$$

wherein $R^{19}$ represents a substituted or unsubstituted alkyl group, a substituted or unsubstituted alkenyl group, a substituted or unsubstituted allyl group, a substituted or unsubstituted aryl group, a halogen atom, a substituted or unsubstituted alkoxyl group, a nitro group, or a cyano group, X represents a halogen atom, and n represents an integer of from 1 to 3;

Formula (VII)

$$R^{20}-Z-CH_{2-m}X_m-R^{21} \qquad (VII)$$

wherein $R^{20}$ represents a substituted or unsubstituted aryl group; $R^{21}$ represents

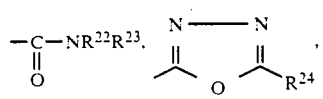

or a halogen atom; Z represents

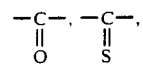

or $-SO_2$, $R^{22}$ and $R^{23}$ each represents a substituted or unsubstituted alkyl group, a substituted or unsubstituted alkenyl group, a substituted or unsubstituted allyl group, a substituted or unsubstituted aryl group, $R^{24}$ has the same meaning as R' in formula (V), X represents a halogen atom, and m represents 1 or 2;

Formula (VIII)

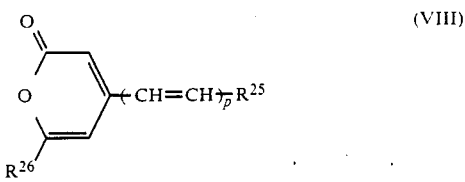

wherein $R^{25}$ represents a substituted or unsubstituted aryl group or a substituted or unsubstituted heterocyclic group; $R^{26}$ represents a trihaloalkyl group or a trihaloalkenyl group each having from 1 to 3 carbon atoms, and p represents 1, 2, or 3;

Formula (IX)

Carbonylmethylene heterocyclic compounds having a trihalogenomethyl group of formula:

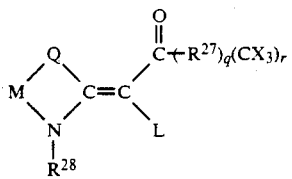

wherein L represents a hydrogen atom or —CO—$(R^{27})_n(CX_3)_m$; M represents a substituted or unsubstituted alkylene group; Q represents a sulfur atom, a selenium atom, an oxygen atom, a dialkylmethylene group, an alken-1,2-ylene group, a 1,2-phenylene group, or N—$R^{28}$; M and Q are taken together to form a 3- or 4-membered ring; $R^{28}$ represents an alkyl group, an aralkyl group, or an alkoxyalkyl group; $R^{27}$ represents a carbocyclic or heterocyclic aromatic ring; X represents a chlorine atom, a bromine atom, or an iodine atom; q is 0 and r is 1, or q is 1 and r is 1 or 2;

Formula (X)

4-Halogeno-5-(halogenomethylphenyl)-oxazole derivatives of formula:

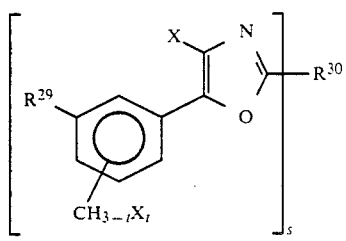

wherein X represents a halogen atom; t represents an integer of from 1 to 3; s represents an integer of from 1 to 4; $R^{29}$ represents a hydrogen atom or $CH_{3-t}X_t$; and $R^{30}$ represents a substituted or unsubstituted s-valent unsaturated organic group; and Formula (XI)

2-(Halogenomethylphenyl)-4-halogeno-oxazole derivative of formula:

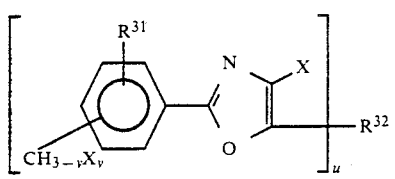

wherein X represents a halogen atom; v represents an integer of from 1 to 3; u represents an integer of from 1 to 4; $R^{31}$ represents a hydrogen atom or $CH_{3-v}X_v$; and $R^{32}$ represents a substituted or unsubstituted u-valent unsaturated organic group.

Specific examples of these compounds having a carbon halogen bond are described below.

Examples of the compounds represented by the formula (V) are described in Wakabayashi, et al., *Bull. Chem. Soc. Japan*, Vol. 42, p. 2924 (1969), e.g., 2-phenyl-4,6-bis(trichloromethyl)-s-triazine, 20(p-chlorophenyl)-4,6-bis(trichloromethyl)-s-triaxine, 2-(p-tolyl)-4,6-bis(trichloromethyl)-s-triazine, 2-(p-methoxyphenyl)-4,6-bis(trichloromethyl)-s-triazine, 2-(2',4'-dichlorophenyl)-4,6-bis (trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, and 2-($\alpha,\alpha,\beta$-trichloroethyl)-4,6-bis(trichloromethyl)-s-triazine; the compounds described in British Patent 1,388,492, e.g., 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine, and 2-(p-methoxystyryl)-4-amino-6-trichloromethyl-s-triazine; the compounds described in JP-A-53-133428, e.g., 2-(4-methoxynaphtho-1yl)-4,6-bis(trichloromethyl)-s-triazine, 2-(4-ethoxynaphtho-1-yl)-4,6-bis(trichloromethyl)-s-triazine, 2-[4-(2-ethoxyethyl)-naphtho-1-yl]-4,6bis(trichloromethyl)-s-triazine, 2-(4,7-dimethoxynaphtho-1-yl)-4,6-bis(trichloromethyl)-s-triazine, and 2-(acenaphtho-5-yl)-4,6-bis(trichloromethyl)-s-triazine; the compounds described in German Patent 3,337,024, e.g.,

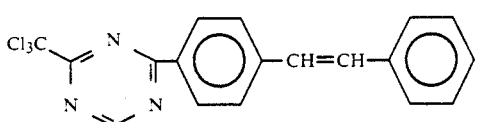

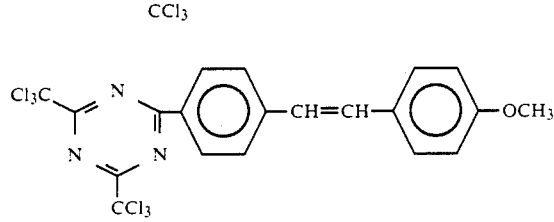

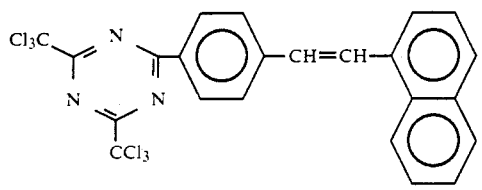

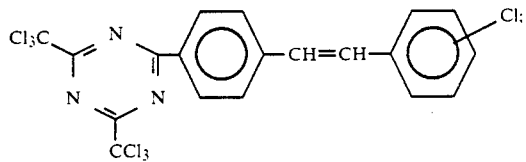

as well as the compounds having the following formulae:

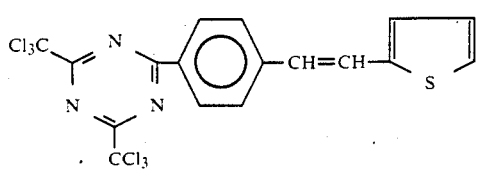

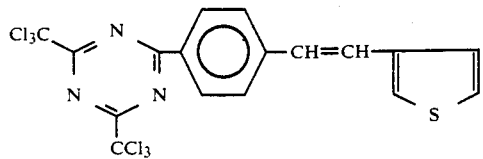

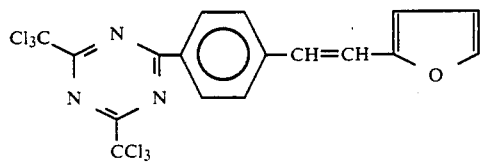

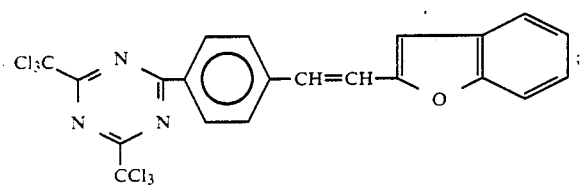

the compounds described in F. C. Schaefer, et al., *J. Org. Cheml.*, Vol. 29, p. 1527 (1964), e.g., 2-methyl-4,6-bis(tribromomethyl)-s-triazine, 2,4,6-tris(dibromomethyl)-s-triazine, 2-amino-4-methyl-6-tribromomethyl-s-triazine, and 2-methoxy-4-methyl-6-trichloromethyl-s-triazine; and the the compounds described in JP-A-62-58241, e.g.,

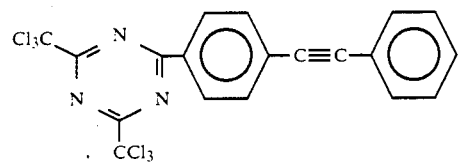

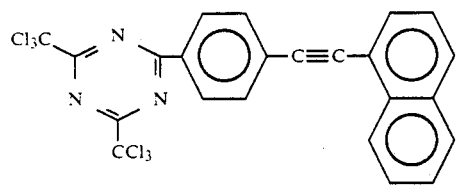

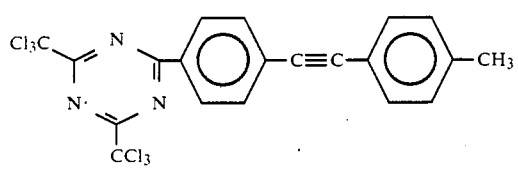

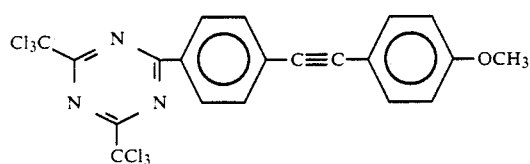

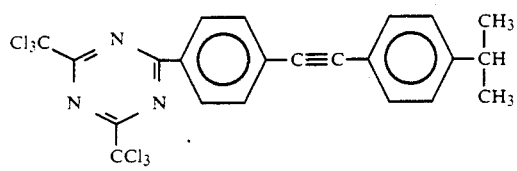

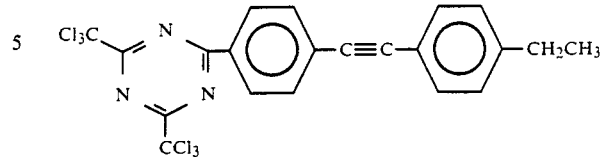

Examples of the compound of formula (VI) include the compounds which can easily be synthesized by those skilled in the art according to the process described in M. P. Hutt, E. F. Elsiager, and L. M. Werbel, *Journal of Heterocyclic Chemistry*, Vol. 7 (No. 3), pp. 511- (1970), e.g.,

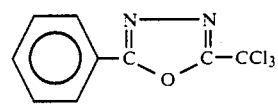

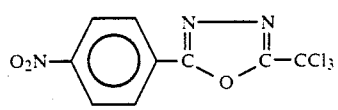

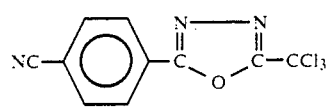

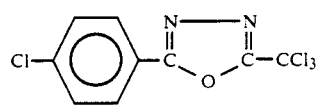

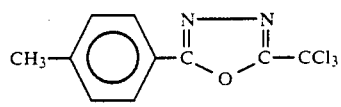

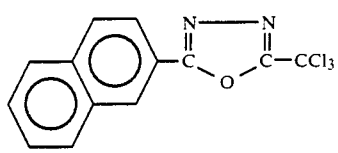

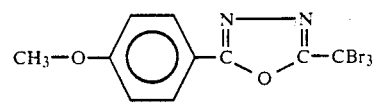

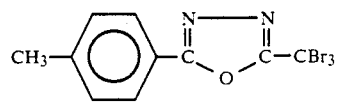

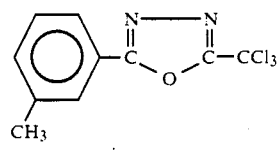

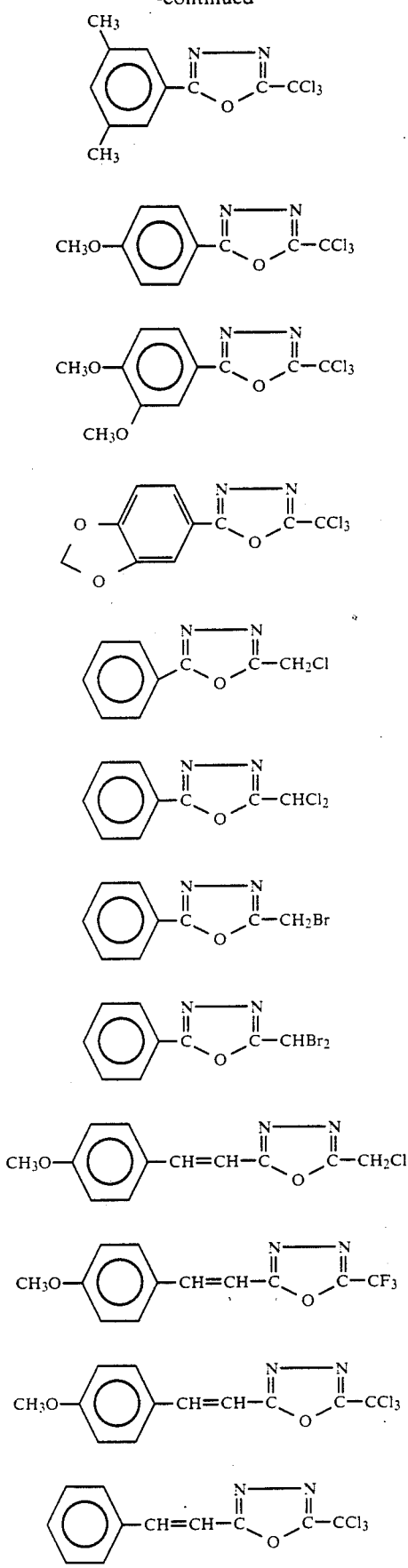
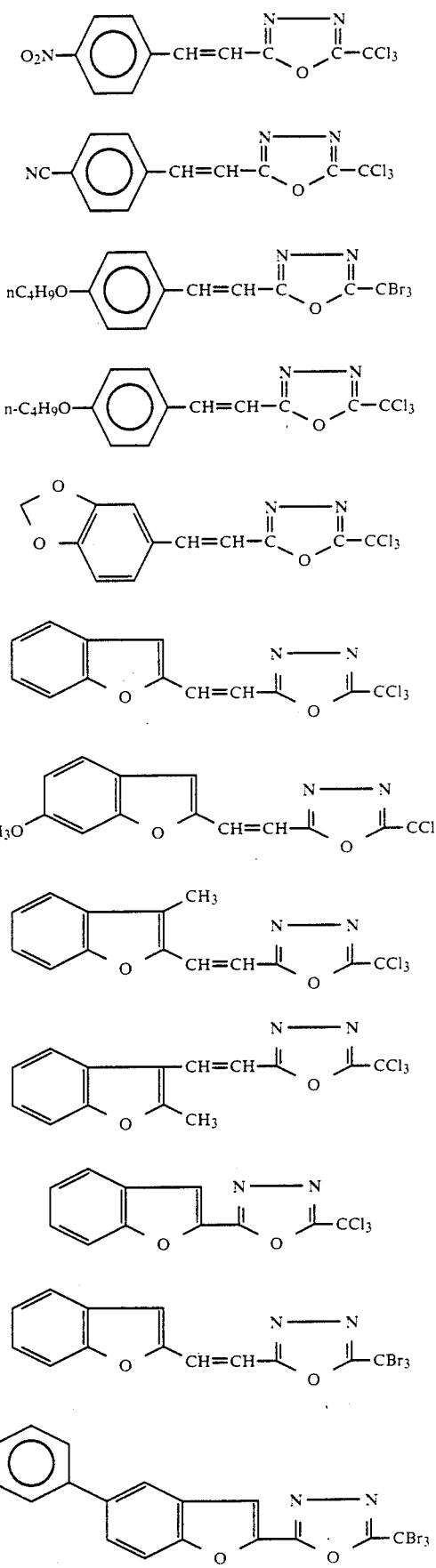

-continued
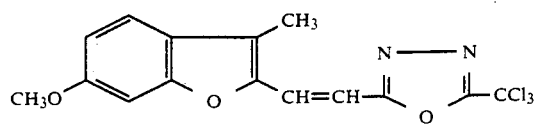
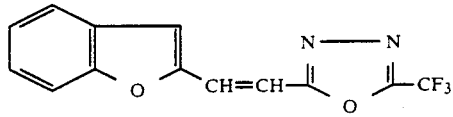
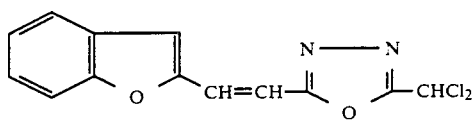
-continued
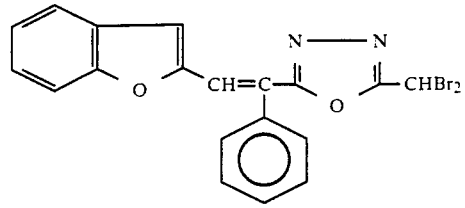
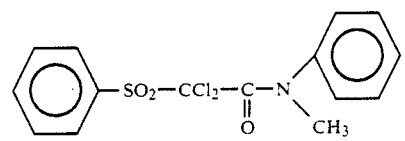
Examples of the compound represented by the formula (VII) include the following compounds:
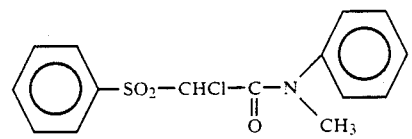
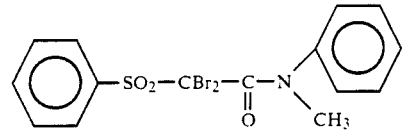
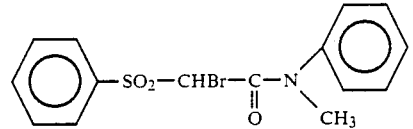
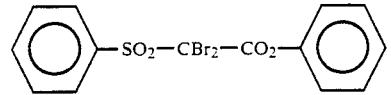
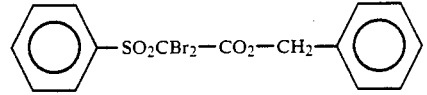
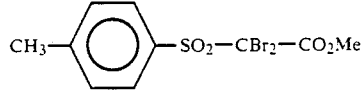
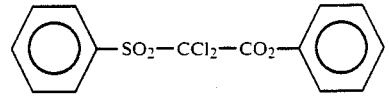

-continued

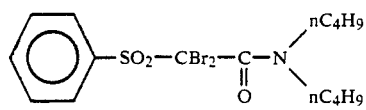

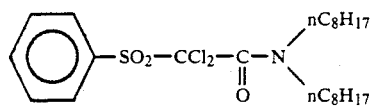

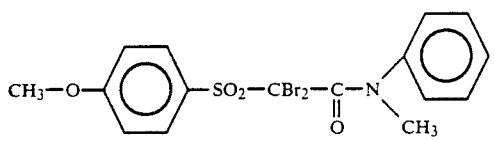

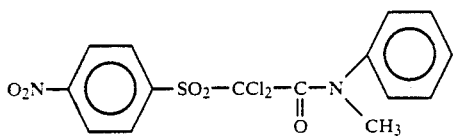

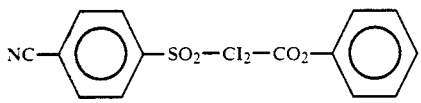

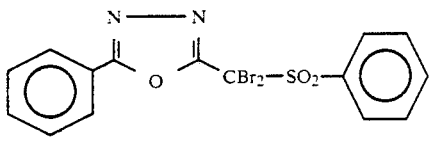

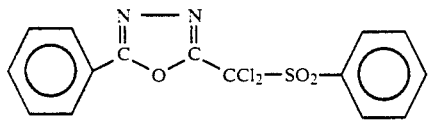

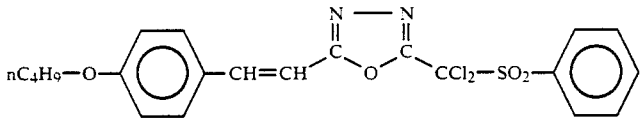

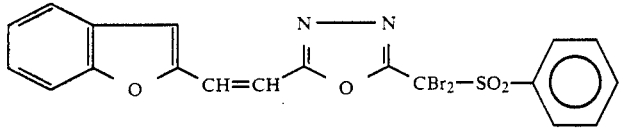

Examples of the compound represented by the formula (VIII) include the compounds described in German Patent 2,641,100, e.g., 4-(4-methoxystyryl)-6-(3,3,3-trichloropropenyl)-2-pyrrone and 4-(3,4,5-trimethoxystryryl)-6-trichloromethyl-2-pyrrone.

Examples of the compound represented by the formula (IX) include the compounds described in German Patent 3,333,450, e.g.,

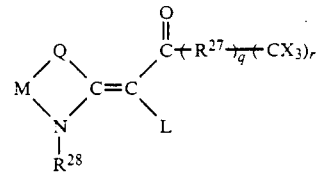

Q = S; R = benzene ring

| | $R^{28}$ | M | L | q | $(CX_3)_r$ |
|---|---|---|---|---|---|
| 1 | $C_2H_5$ | 1,2-phenylene | H | 1 | 4-$CCl_3$ |
| 2 | $CH_2C_6H_5$ | 1,2-phenylene | H | 1 | 4-$CCl_3$ |
| 3 | $C_2H_5$ | 1,2-phenylene | H | 1 | 3-$CCl_3$ |
| 4 | $C_2H_5$ | 1,2-phenylene | H | 1 | 4-$CF_3$ |
| 5 | $C_2H_5$ | 5-$CH_3$-1,2-phenylene | H | 0 | $CCl_3$ |

-continued

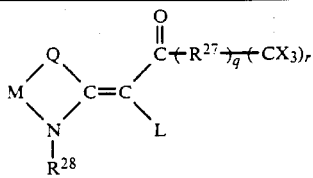

Q = S; R = benzene ring

| | $R^{28}$ | M | L | q | $(CX_3)_r$ |
|---|---|---|---|---|---|
| 6 | $CH_2C_6H_5$ | 1,2-phenylene | H | 0 | $CCl_3$ |
| 7 | $C_2H_4OCH_3$ | 1,2-phenylene | H | 1 | $4\text{-}CCl_3$ |

Examples of the compound represented by the formula (X) include the compounds described in German Patent 3,021,590, e.g.,

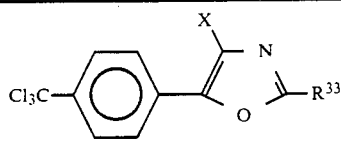

| | $R^{33}$ | X |
|---|---|---|
| 1 | 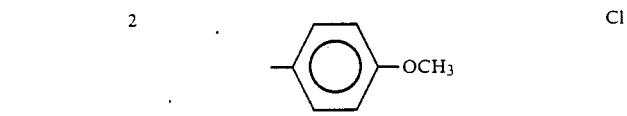 | Cl |
| 2 | 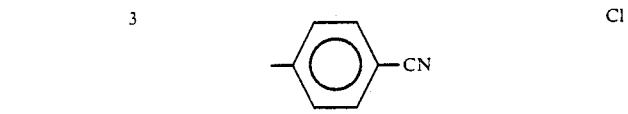 | Cl |
| 3 | (phenyl-CN) | Cl |

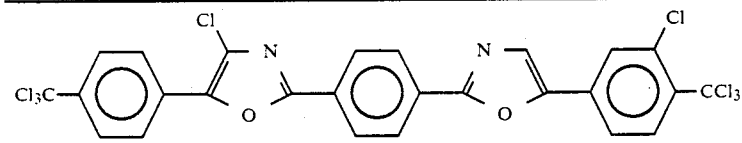

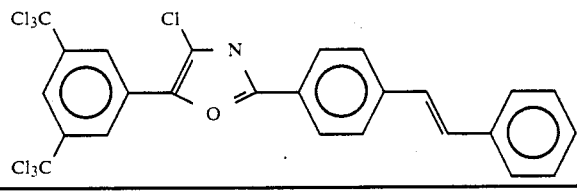

Examples of the compound represented by the formula (XI) include the compounds described in German Patent 3,021,599, e.g.,

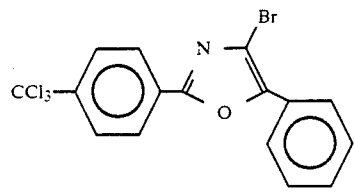

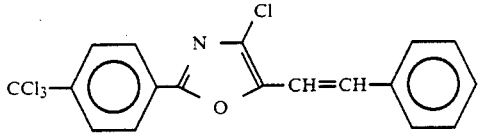

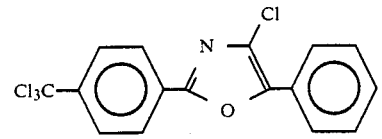

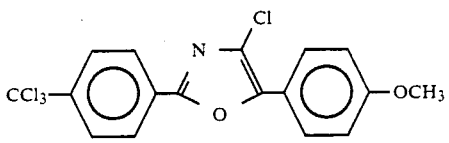

The aromatic onium salt as compound (b) of component (iii) ;includes aromatic onium salts of the group, V, VI, and VII elements, specifically N, P, As, Sb, Bi, O, S, Se, Te, and I. Examples of these aromatic onium salts are described in JP-B-52-14277, JP-B-52-14278, and JP-B-52-14279. Specific examples are shown below.

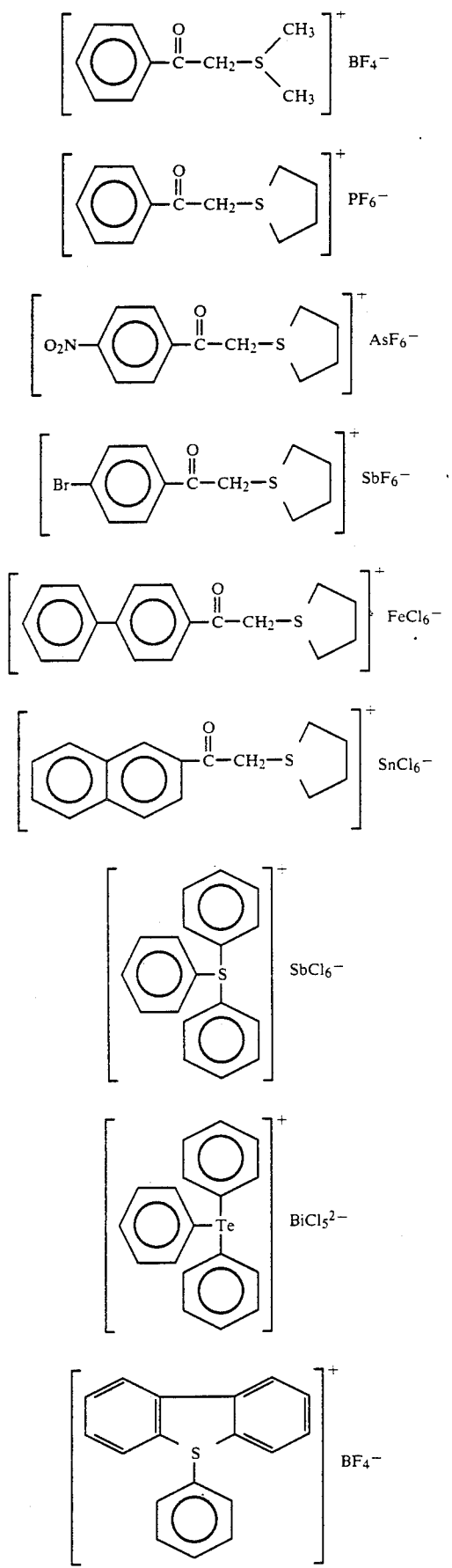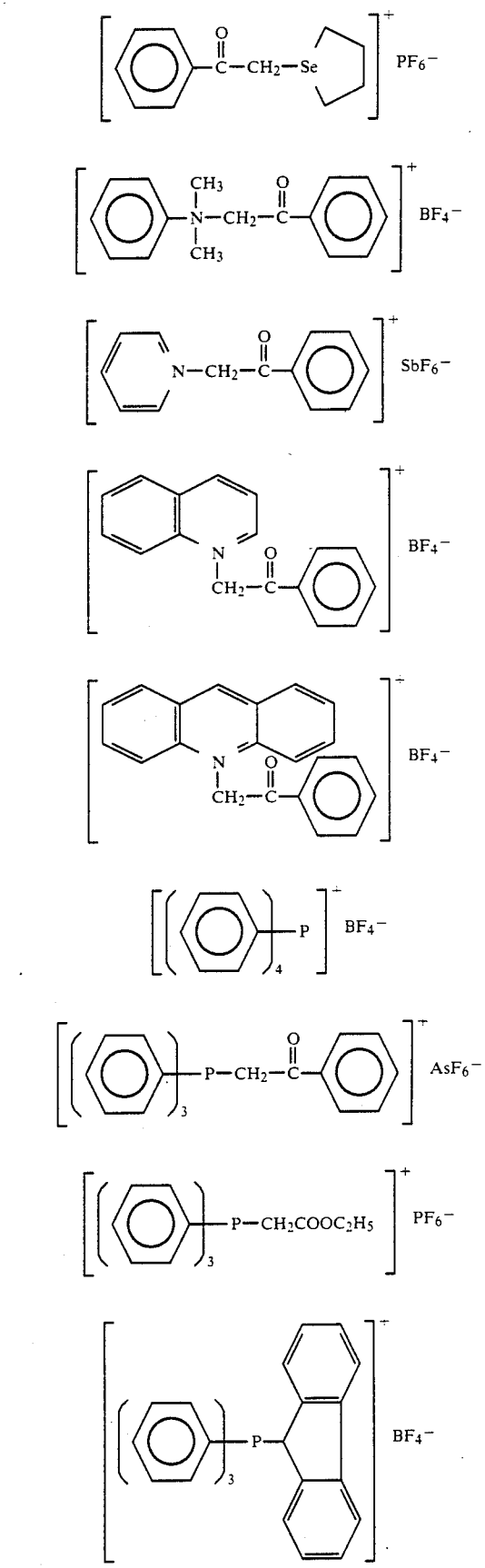

-continued

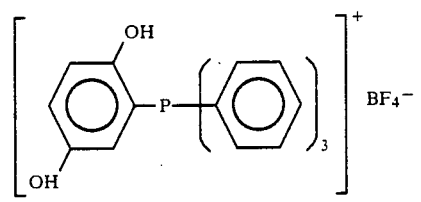

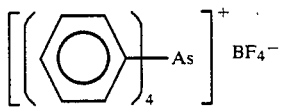

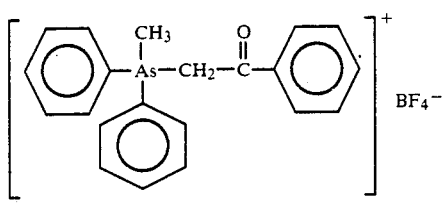

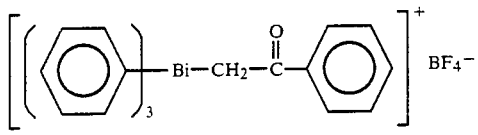

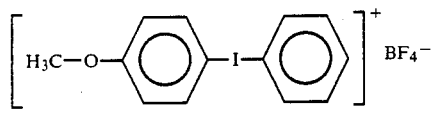

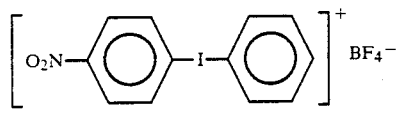

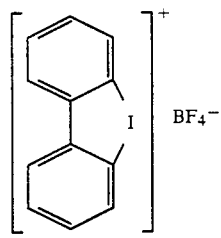

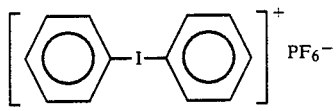

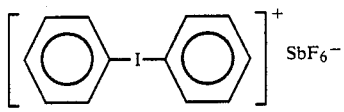

Of these aromatic onium salts preferred are BF₄ salts and PF₆ salts, and more preferred are BF₄ or PF₆ salts of aromatic iodonium salts.

The organic peroxide compounds (c) of component (iii) embrace almost all organic compounds containing at least one oxygen-oxygen bond per molecule. Specific examples of the organic peroxide (c) are methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1-bis(t-butylperoxy)cyclohexane, 2,2-bis(t-butylperoxy)butane, t-butyl hydroperoxide, cumene hydroperoxide, diisopropylbenzene hydroperoxide, p-methanehydroperoxide, 2,5-dimethylhexane-2,5-dihydroperoxide, 1,1,3,5-tetramethylbutyl hydroperoxide, di-t-butyl peroxide, t-butylcumyl peroxide, dicumyl peroxide, bis(t-butylperoxyisopropyl)benzene, 2,5-dimethyl-2,5-di(t-butylperoxy)hexane, 2,5-dimethyl-2,5-di(t-butylperoxy)hexyn-3, acetyl peroxide, isobutyl peroxide, octanoyl peroxide, decanoyl peroxide, lauroyl peroxide, 3,5,5-trimethylhexanoyl peroxide, succinic acid peroxide, benzoyl peroxide, 2,4-dichlorobenzoyl peroxide, m-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, t-butyl peroxyacetate, t-butyl peroxypivalate, t-butyl peroxyneodecanoate, t-butyl peroxyoctanoate, t-butyl peroxy-3,5,5-trimethylhexanoate, t-butyl peroxylaurate, t-butyl peroxybenzoate, di-t-butyl diperoxyisophthlate, 2,5-dimethyl-2,5-di(benzoylperoxy)hexane, t-butyl maleate peroxide, t-butyl peroxyisopropylcarbonate, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyldi(t-butylperoxydihydrodiphthalate), and carbonyldi(t-hexylperoxydihydrodiphthalate).

Preferred of them are ester peroxides, e.g., 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(t-cumylperoxycarbonyl)benzophenone, 3,3',4,4'-tetra(p-isopropylcumylperoxycarbonyl)benzophenone, and di-t-butyl diperoxyisophthalate.

The thio compounds (d) of component (iii) are represented by formula (II). These compounds are tautomers as shown by the two formulae.

In formula (II), the alkyl group as represented by $R^4$ preferably contains from 1 to 4 carbon atoms. The aryl group as represented by $R^4$ preferably includes those having from 6 to 10 carbon atoms, e.g., phenyl and naphthyl groups. The substituted aryl group includes the above-described aryl groups substituted with a halogen atom (e.g., chlorine), an alkyl group (e.g., methyl), or an alkoxyl group (e.g., methoxy, ethoxy).

Specific examples of the thio compounds of the formula (II) are shown below.

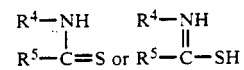

| No. | $R^4$ | $R^5$ |
|---|---|---|
| 1 | H | H |
| 2 | H | CH₃ |
| 3 | CH₃ | H |
| 4 | CH₃ | CH₃ |
| 5 | C₆H₅ | C₂H₅ |
| 6 | C₆H₅ | C₄H₉ |
| 7 | C₆H₄Cl | CH₃ |
| 8 | C₄H₄Cl | C₄H₉ |
| 9 | C₆H₄—CH₃ | C₄H₉ |
| 10 | C₆H₄—OCH₃ | CH₃ |

-continued

| No. | R⁴ | R⁵ |
|---|---|---|
| 11 | $C_6H_4-OCH_3$ | $C_2H_5$ |
| 12 | $C_6H_4-OC_2H_5$ | $CH_3$ |
| 13 | $C_6H_4-OC_2H_5$ | $C_2H_5$ |
| 14 | $C_6H_4-OCH_3$ | $C_4H_9$ |
| 15 | $-(CH_2)_2-$ | |
| 16 | $-(CH_2)_2-S-$ | |
| 17 | $-CH(CH_3)-CH_2-S-$ | |
| 18 | $-CH_2-CH(CH_3)-S-$ | |
| 19 | $-C(CH_3)_2-CH_2-S-$ | |
| 20 | $-CH_2-C(CH_3)_2-S-$ | |
| 21 | $-(CH_2)_2-O-$ | |
| 22 | $-CH(CH_3)-CH_2-O-$ | |
| 23 | $-C(CH_3)_2-CH_2-O-$ | |
| 24 | $-CH=CH-N(CH_3)-$ | |
| 25 | $-(CH_2)_3-S-$ | |
| 26 | $-(CH_2)_2CH(CH_3)-S-$ | |
| 27 | $-(CH_2)_3-O-$ | |
| 28 | $-(CH_2)_5-$ | |
| 29 | $-C_6H_4-O-$ | |
| 30 | $-N=C(SCH_3)-S-$ | |
| 31 | $-C_6H_4-NH-$ | |
| 32 | 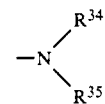 | |

The hexaarylbiimidazole compound (e) of component (III) includes 2,2′-bis(o-chlorophenyl)-4,4′,5,5′-tetraphenylbiimidazole, 2,2′-bis(o-bromophenyl)-4,4′,5,5′-tetraphenylbiimidazole, 2,2′-bis(o,p-dichlorophenyl)-4,4′,5,5′-tetraphenylbiimidazole, 2,2′-bis(o-chlorophenyl)-4,4′,5,5′-tetra(m-methoxyphenyl)biimidazole, 2,2′-bis(o,o′-dichlorophenyl)-4,4′,5,5′-tetraphenylbiimidazole, 2,2′-bis(o-nitrophenyl)-4,4′,5,5′-tetraphenylbiimidazole, 2,2′-bis(o-methylphenyl)-4,4′,5,5′-tetraphenylbiimidazole, and 2,2′-bis(o-trifluoromethylphenyl)-4,4′,5,5′-tetraphenylbiimidazole.

The ketoxime ester (f) of component (iii) includes 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, and 2-ethoxycarbonyloxyimino-1-phenylpro-1-one.

If desired, the photopolymerizable composition of the present invention essentially containing the above-described components (i) to (iii) can further contain component (iv) and/or component (v).

Component (iv) is a compound represented by formula (III) shown before.

In formula (III), the alkyl group as represented by $R^6$, $R^7$, $R^8$, or $R^9$ includes straight chain, branched, and cyclic alkyl groups, preferably having from 1 to 18 carbon atoms. Specific examples are methyl, ethyl, propyl, isopropyl, butyl, pentyl, hexyl, octyl, stearyl, cyclobutyl, cyclopentyl and cyclohexyl groups.

The substituted alkyl group as represented by $R^6$ through $R^9$ includes the above-enumerated alkyl groups each of which is substituted with a halogen atom (e.g., chlorine, bromine), a cyano group, a nitro group, an aryl group (preferably a phenyl group), a hydroxyl group, $$-N\begin{matrix}R^{34}\\R^{35}\end{matrix}$$

(wherein $R^{34}$ and $R^{35}$ each represents a hydrogen atom, an alkyl group having from 1 to 14 carbon atoms, or an aryl group), $-COOR^{36}$ (wherein $R^{36}$ represents a hydrogen atom, an alkyl group having from 1 to 14 carbon atoms, or an aryl group), $-OCOR^{37}$, or $-OR^{37}$ (wherein $R^{37}$ represents an alkyl group having from 1 to 14 carbon atoms or an aryl group).

The aryl group as represented by $R^6$ through $R^9$ includes mono- to tricyclic aryl groups, e.g., phenyl and naphthyl groups. The substituted aryl group includes the above-enumerated aryl groups each of which is substituted with any of the above-described substituents as recited with respect to the substituted alkyl group, or an alkyl group having from 1 to 14 carbon atoms.

The alkenyl group as represented by $R^6$ through $R^9$ includes straight chain, branched, or cyclic alkenyl groups having from 2 to 18 carbon atoms. Substituents of the substituted alkenyl group are the same as those enumerated with respect to the substituted alkyl group.

The alkynyl group as represented by $R^6$ through $R^9$ includes straight chain or branched alkenyl groups having from 2 to 18 carbon atoms, and substituents for the substituted alkenyl group are the same as those enumerated above with respect to the substituted alkyl group.

The heterocyclic group as represented by $R^6$ through $R^9$ includes 5- or more-membered, preferably 5- to 7-membered rings containing at least one of N, S, and O as a hetero atom. The heterocyclic ring may have a condensed ring. Further, the heterocyclic ring may be substituted with any of the substituents recited above with respect to the substituted aryl group.

Specific examples of the compound represented by formula (III) of component (iv) include those described in U.S. Pat. Nos. 3,567,453 and 4,343,891, European Patents 109,772 and 109,773; and, in addition, the following compounds.

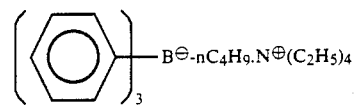 (iv)-1

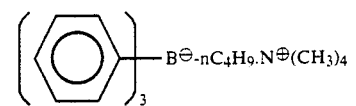 (iv)-2

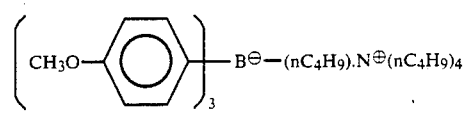 (iv)-3

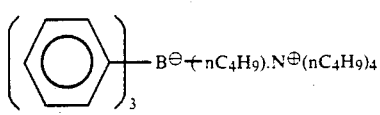 (iv)-4

 (iv)-5

-continued

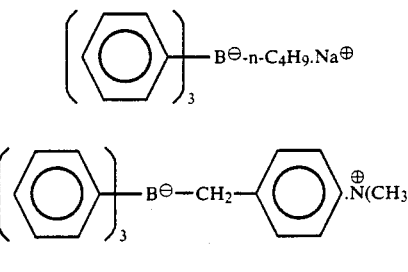
(iv)-6

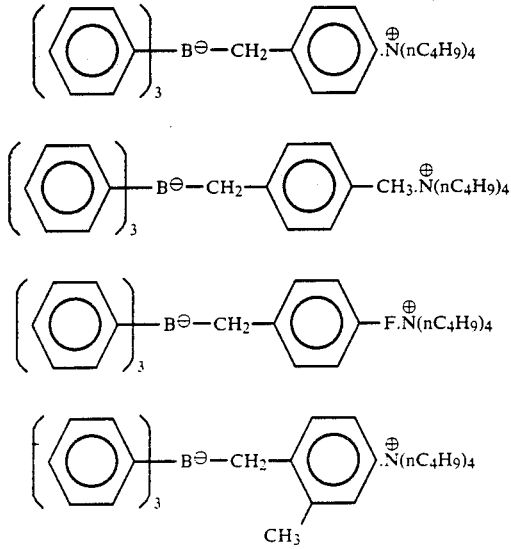
(iv)-7
(iv)-8
(iv)-9
(iv)-10
(iv)-11

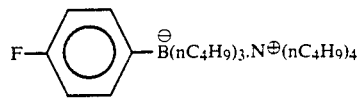
(iv)-12

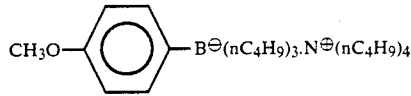
(iv)-13

Component (v) is a compound represented by formula (IV).

In formula (IV), the alkyl group as represented by $R^{10}$ or $R^{11}$ includes those having from 1 to 20 carbon atoms, e.g., methyl, ethyl, and propyl groups. The alkylene group formed by $R^{10}$ and $R^{11}$ connected to each other includes tetramethylene and pentamethylene groups. The alkyl group as represented by $R^{12}$, $R^{13}$, $R^{14}$, $R^{15}$, and $R^{16}$ in the aromatic group Ar includes those containing from 1 to 4 carbon atoms. The alkenyl group as represented by $R^{12}$ through $R^{16}$ includes those having from 3 to 12 carbon atoms. The aryl group as represented by $R^{12}$ through $R^{16}$ includes a phenyl group. The alkoxyl group as represented by $R^{12}$ through $R^{16}$ includes those having from 1 to 4 carbon atoms. The acyl group as represented by $R^{17}$ includes acetyl, propionyl, and acryloyl groups.

Specific examples of the compound of formula (IV) are shown below.

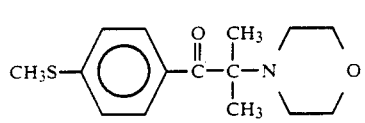
(v)-1

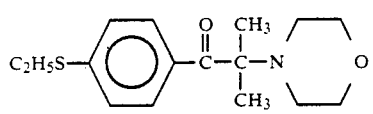
(v)-2

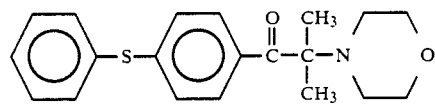
(v)-3

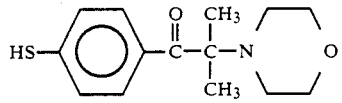
(v)-4

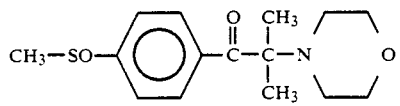
(v)-5

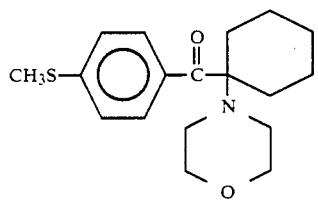
(v)-6

-continued

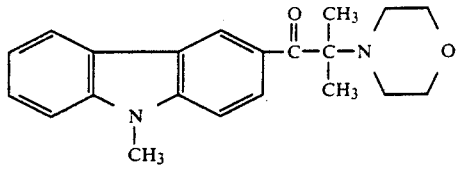
(v)-7

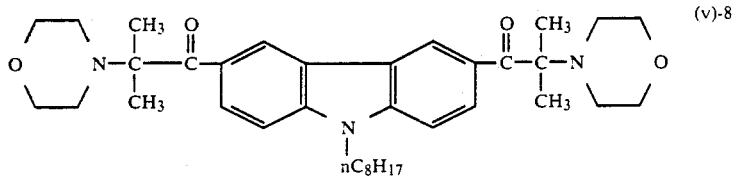
(v)-8

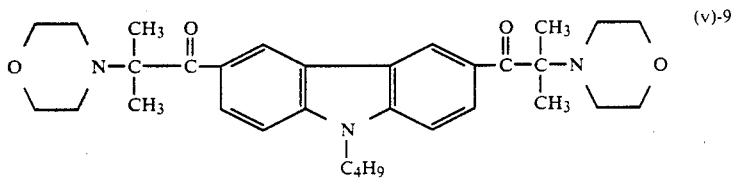
(v)-9

Preferred of these compounds are (v)-1, (v)-2, (v)-8 and (v)-9

The photopolymerization initiator system which is composed of the components (ii)+(iii) and optional components (iv) and/or (v) according to the present invention is present in the photopolymerizable composition usually at relatively a low concentration. An undesirable high concentration of the photopolymerization initiator system results in unfavorable effects, such as shield of actinic rays. Accordingly, the photopolymerization initiator system is preferably used in an amount ranging from 0.01 to 60%, and more preferably from 1 to 30%, by weight based on the sum of the photopolymerizable ethylenically unsaturated compound and a linear organic high polymer which may be added, if desired (hereinafter described in detail).

The weight ratio of component (ii) to component (iii), both constituting the initiator system, is preferably from 0.05 to 30 parts, more preferably from 0.1 to 10 parts, and most preferably from 0.2 to 5 parts, by weight of component (iii) per part by weight of the organic dye as component (ii).

Where component (iv) is used in combination, it is preferably added in an amount of from 0.01 to 50 parts, more preferably from 0.02 to 20 parts, and most preferably from 0.05 to 10 parts, by weight per part by weight of the organic dye, component (ii). Where component (v) is used in combination, it is preferably added in an amount of from 0.01 to 50 parts, more preferably from 0.02 to 20 parts, and most preferably from 0.05 to 10 parts, by weight per part by weight of the organic dye, component (ii).

It is preferred that the photopolymerizable composition of the invention further contain (vi) a linear organic high polymer as a binder. Such a linear organic high polymer is not particularly limited as long as it exhibits compatibility with the photopolymerizable ethylenically unsaturated compound. It is preferably selected from those which are soluble in or swellable with water or weakly alkaline water so as to make it feasible to perform development with water or weakly alkaline water. The linear organic high polymer is selected and used so as not only to function as a film-forming agent but to permit of development with a water, weakly alkaline water or organic solvent developer. For example, use of a water-soluble organic high polymer makes it possible to conduct development with water. Examples of such a linear organic high polymer include addition polymers having a carboxyl group in the side chain thereof, such as those described in JP-A-59-44615, JP-B-54-34327, JP-B-58-12577, JP-B-54-25957, JP-A-54-92723, JP-A-59-53836, and JP-A-59-71048, e.g., methacrylic acid copolymers, acrylic acid copolymers, itaconic acid copolymers, crotonic acid copolymers, maleic acid copolymers, and partially esterified maleic acid copolymers. Acidic cellulose derivatives having a carboxyl group in the side chain thereof are also useful. In addition, an addition product between an addition polymer having a hydroxyl group and a cyclic acid anhydride is useful. Preferred of these water-soluble high polymers are copolymers of benzyl (meth)acrylate, (meth)acrylic acid and, if desired, other addition polymerizable vinyl monomers and copolymers of allyl (meth)acrylate, (meth)acrylic acid and, if desired, other addition polymerizable vinyl monomers. Polyvinylpyrrolidone and polyethylene oxide, etc. are also useful as a water-soluble linear organic high polymer. Further, alcohol-soluble nylon resins and polyethers of 2,2-bis(4-hydroxyphenyl)propane and epichlorohydrin are also useful for strengthening a cured film. These linear organic high polymers can be incorporated into the composition in an arbitrarily proportion, but a proportion exceeding 90% by weight based on the whole composition does not produce favorable results from the standpoint of cured image strength. A preferred proportion is from 30 to 85% by weight based on the whole composition. Further, a weight ratio of the photopolymerizable ethylenically unsaturated compound to the linear organic high polymer preferably ranges from 1/9 to 7/3, and more preferably from 3/7 to 5/5.

In addition to the above-described basic components (i) to (vi), the photopolymerizable composition of the present invention preferably contains a small amount of a thermal polymerization inhibitor in order to prevent unnecessary thermal polymerization of the polymerizable ethylenically unsaturated compound during the preparation or preservation of the composition. Suitable thermal polymerization inhibitors include hydroquinone, p-methoxyphenol, di-t-butyl-p-cresol, pyrogallol, t-butyl catechol, benzoquinone, 4,4,-thiobis(3-methyl-6-t-butylphenol), 2,2,-methylenebis(4-methyl-6-t-butylphenol), and N-nitrosophenylhydroxylamine cerous salt. The thermal polymerization inhibitor is suitably added in an amount of from about 0.01 to about 5% based on the total weight of the composition.

If desired, in order to avoid polymerization inhibition due to oxygen, a higher fatty acid derivative, e.g., behenic acid and behenic acid amide, can be added to the composition and localized on the surface of a photosensitive layer during drying subsequent to coating. Such a higher fatty acid derivative is suitably added in an amount of from about 0.5 to about 10% by weight based on the total composition.

The composition may further contain a dye or a pigment for the purpose of coloring a photosensitive layer. The dye or pigment is suitably added in an amount of from about 0.5 to about 5% by weight based on the total composition.

The composition may furthermore contain an inorganic filler or any other known additives for the purpose of improving physical properties of a cured film.

The photopolymerizable composition according to the present invention is used as dissolved in various organic solvents on coating on a support. Suitable solvents which can be used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These solvents may be used either individually or as a mixture of two or more thereof. A coating composition suitably has a solids content of from 2 to 50% by weight.

The coating composition is coated on a support to a dry coverage usually of from about $0.1/m^2$ to about 10 $g/m^2$, and preferably from 0.5 to 5 $g/m^2$.

The support which can be used in the present invention is selected from dimensionally stable sheets, such as paper; paper laminated with a synthetic resin (e.g., polyethylene, polypropylene, and polystyrene); a metallic sheet of aluminum (inclusive of aluminum alloys), zinc, or copper; a synthetic resin film, e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal; and paper or synthetic resin films on which the above described metal is laminated or vacuum deposited. Of these supports particularly preferred is an aluminum sheet in view of marked dimensional stability and inexpensiveness. In addition, a composite material comprising a polyethylene terephthalate film and an aluminum sheet as described in JP-B-48-18327 is also preferred.

In cases of using a support having a metal surface, particularly an aluminum surface, it is preferable to subject it to a surface treatment, such as graining, soaking in an aqueous solution of sodium silicate, potassium fluorozirconate, a phosphate, etc., and anodic oxidation.

In particular, an aluminum sheet having been treated by graining followed by soaking in a sodium silicate aqueous solution is preferably employed. An aluminum support prepared by subjecting an aluminum sheet to anodic oxidation and then soaking in an alkali metal silicate aqueous solution as described in JP-B-47-5125 is also suitable. The anodic oxidation treatment can be carried out by passing electrical current through an electrolytic solution comprising an organic or non-organic solution of an inorganic acid (e.g., phosphoric acid, chromic acid, sulfuric acid, and boric acid), an organic acid (e.g., oxalic acid and sulfamic acid), or a salt thereof, either alone or in combination of two or more thereof using the aluminum sheet as an anode.

A silicate electrodeposition treatment as described in U.S. Pat. No. 3,658,662 is effective. A surface treatment combination of electrolytic graining, anodic oxidation, and sodium silicate treatment as taught in JP-B-46-27481, JP-A-52-58602, and JP-A-52-30503 is also useful.

Also suitable is a combination of mechanical surface roughening, chemical etching, electrolytic graining, anodic oxidation, and sodium silicate treatment in this order.

Further, it is effective to use a support prepared by these surface treatments followed by undercoating with a water-soluble resin (e.g., polyvinylphosphonic acid, homo- or copolymers having a sulfo group in the side chain thereof, and polyacrylic acid), a water-soluble metal salt (e.g., zinc borate), a yellow dye, or an amine salt.

The above-stated surface treatments aim not only to render the support surface hydrophilic but to prevent harmful reactions of the photopolymerizable composition provided thereon and to improve adhesion to the photosensitive layer.

For the purpose of preventing air oxygen from exerting a polymerization inhibitory effect, a protective layer comprising oxygen-barrier polymer, such as polyvinyl alcohol (especially the one having a degree of saponification of 99% or more) and acidic cellulose derivatives, may be provided on the photosensitive layer of the photopolymerizable composition. For details of the protective layer coating method, reference can be made, e.g., in U.S. Patent 3,458,311 and JP-B-55-49729.

The photopolymerizable composition according to the present invention can be applied to general photopolymerization reactions. It is also applicable to various fields, including photoresists for the production of printing plates, printed circuit boards, etc. In particular, high sensitivity and spectral sensitivity in a wide wavelength range up to the visible region which are characteristic of the photopolymerizable composition of this invention can be taken advantage of in application to photosensitive materials for visible light of lasers, e.g., an argon laser, to thereby achieve satisfactory results.

The photosensitive material using the photopolymerizable composition of the present invention is imagewise exposed to light and then developed with a developing solution to remove unexposed areas of the photosensitive layer to thereby obtain a cured image. Suitable developing solutions for use in the production of lithographic printing plates include those described in JP-B-57-7427, for example, an aqueous solution of an inorganic alkali agent, such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogencarbonate, and aqueous ammonia; and an aqueous solution of an organic alkali agent, such as monoethanolamine and diethanolamine. These alkaline aqueous solutions usually have a concentration of from 0.1 to 10% by weight, and preferably from 0.5 to 5% by weight.

If desired, the alkaline aqueous developing solution may contain a small amount of a surface active agent or an organic solvent, e.g., benzyl alcohol, 2-phenoxyethanol, and 2-butoxyethanol. Examples of these additives are described, e.g., in U.S. Pat. Nos. 3,375,171 and 3,615,480.

In addition, the developing solutions disclosed in JP-A-50-26601, JP-A-58-54341, JP-B-56-39464, and JP-B-56-42860 are also excellent.

The photopolymerizable composition according to the present invention exhibit high sensitivity to actinic light of a broad range of from the ultraviolet region through the visible region. Accordingly, a wide variety of light sources can be utilized for exposure, including a ultrahigh-, high-, medium-, or low-pressure mercury lamp, a chemical lamp, a carbon arc lamp, a xenon lamp, a metal halide lamp, various lasers of visible to ultraviolet region, a fluorescent lamp, a tungsten lamp, as well as sunlight.

The present invention is now illustrated in greater detail with reference to Examples and Comparative Examples, but it should understood that the present invention is not deemed to be limited thereto. In these examples, all the percents are by weight unless otherwise specified.

EXAMPLES 1 TO 16 AND COMPARATIVE EXAMPLES 1 to 16

A 0.30 mm thick aluminum sheet was subjected to surface graining using a combination of a nylon brush and an aqueous suspension of a pumice powder of 400 mesh and thoroughly washed with water. The grained sheet was soaked in a 10% sodium hydroxide aqueous solution at 70° C. for 60 seconds to effect etching, washed with running water, neutralized with a 20% nitric acid aqueous solution, and washed with water again. The sheet was then subjected to electrolytic surface roughening in a 1% nitric acid aqueous solution using a sine wave alternating current under the conditions of $V_A = 12.7$ V and an anodic electric amount of 160 coulomb/dm$^2$ to attain a surface roughness (Ra) of 0.6 $\mu$m. After the sheet was soaked in a 30% sulfuric acid aqueous solution at 55° C. to desmut, it was subjected to anodic oxidation in a 20% sulfuric acid aqueous solution for 2 minutes at a current density of 2 A/dm$^2$ to form an anodic oxidation film having a thickness of 2.7 g/m$^2$.

The thus treated aluminum sheet was coated with a photosensitive composition having a formulation shown below to a dry thickness of 1.4 g/m$^2$ and dried at 80° C. for 2 minutes to form a photosensitive layer.

Photosensitive Composition Formulation:

| | |
|---|---|
| Trimethylolpropane tri(acryloyloxypropyl) ether | 2.0 g |
| Allyl methacrylate/methacrylic acid | 2.0 g |
| copolymer (80/20 by mol) | |
| Photopolymerization initiator system | see Table 1 |
| Fluorine type nonionic surface active agent | 0.03 g |
| Methyl ethyl ketone | 20 g |
| Propylene glycol monomethyl ether acetate | 20 g |

On the thus formed photosensitive layer was further coated a 3% aqueous solution of polyvinyl alcohol (degree of saponification: 86.5 to 89%; degree of polymerization: 1000) to a dry thickness of 2 g/m$^2$ and dried at 100° C. for 2 minutes.

Each of the resulting samples was exposed to (i) a monochromatic light of visible light emitted from a tungsten lamp through an optical filter "Kenko Optical Filter BP-49" (produced by Kenko Co., Ltd.) or (ii) an argon laser single beam (wavelength: 488 nm; beam diameter: 25 $\mu$m) emitted from an argon laser "Model 95-3" (produced by Lexel Co., Ltd. by scanning through an ND filter at a varied beam intensity.

Photosensitivity in exposure to visible light (i) was determined by using Fuji PS Step Guide produced by Fuji Photo Film Co., Ltd. (a step tablet containing 15 steps having a transmission optical density stepwise increasing from 0.05 in the first step to the 15th step by 0.15). The number of steps which were cleared when exposed at an illuminance of 25 lux for 80 seconds was taken as a sensitivity.

Photosensitivity in laser beam scanning (ii) was obtained by determining the intensity of the argon laser beam at which a line width of 25 $\mu$m could be reproduced by development (hereinafter described).

The results of these determinations are shown in Table 1 below.

The exposed sample was developed by immersion in a developing solution having the following formulation at 25° C. for 1 minute.

Developing Solution Formulation

| | |
|---|---|
| 1K potassium silicate | 30 g |
| Potassium hydroxide | 15 g |
| C$_{12}$H$_{25}$—⟨⟩—O—⟨⟩—SO$_3$Na | 3 g |
| Water | 1000 g |

The following compounds were used as photopolymerization initiators either alone or in combination thereof in amounts shown in Table 1 below.

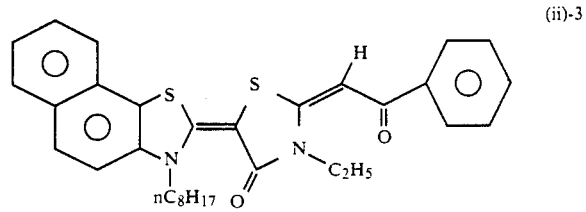

(ii)-3

-continued (ii)-6
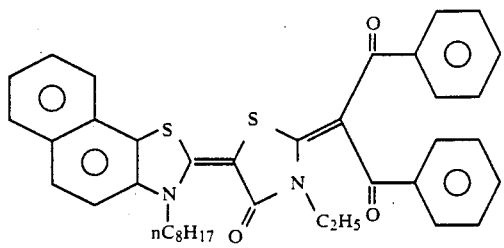

(ii)-7
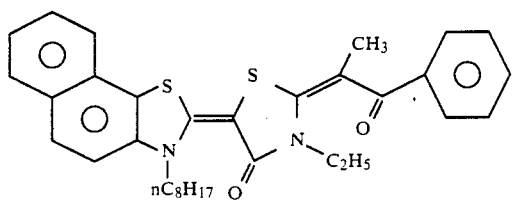

(iii)-1
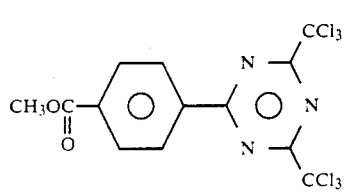

(iii)-2
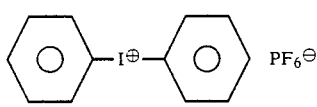

(iii)-3
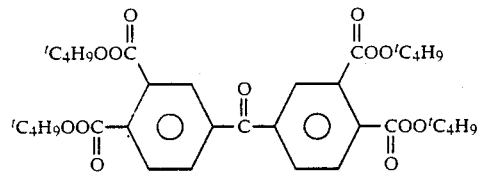

(iii)-4
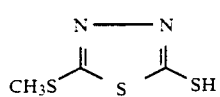

(iii)-5
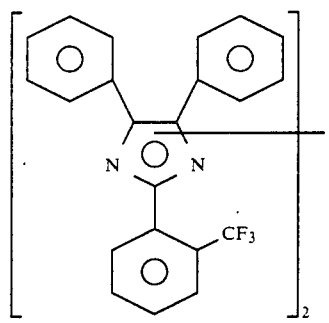

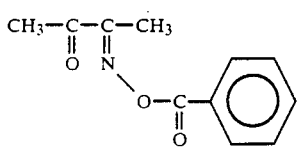

(iv)-4
Ph$_3$B$^\ominus$nC$_4$H$_9$.N$^\oplus$($^n$C$_4$H$_9$)$_4$ (iv)-8
Ph$_3$B$^\ominus$CH$_2$Ph.N$^\oplus$($^n$C$_4$H$_9$)$_4$

TABLE 1

| Example No. | Photopolymerization Initiator System | (g) | Number of Steps Cleared With Visible Light | Sensitivity With Argon Laser Beam (mJ/cm$^2$) |
|---|---|---|---|---|
| Ex. 1 | (ii)-3 | 0.1 | 6.2 | 2.1 |
|  | (iii)-1 | 0.05 |  |  |
| Ex. 2 | (ii)-6 | 0.1 | 6.1 | 2.2 |
|  | (iii)-1 | 0.05 |  |  |
| Ex. 3 | (ii)-7 | 0.1 | 4.0 | 4.1 |
|  | (iii)-1 | 0.05 |  |  |
| Ex. 4 | (ii)-3 | 0.1 | 5.0 | 3.0 |
|  | (iii)-2 | 0.2 |  |  |
| Ex. 5 | (ii)-3 | 0.1 | 7.2 | 1.5 |
|  | (iii)-3 | 0.4 |  |  |
| Ex. 6 | (ii)-3 | 0.1 | 6.2 | 2.1 |
|  | (iii)-4 | 0.1 |  |  |
| Ex. 7 | (ii)-3 | 0.1 | 6.3 | 2.1 |
|  | (iii)-4 | 0.1 |  |  |
|  | (iii)-5 | 0.2 |  |  |
| Ex. 8 | (ii)-3 | 0.1 | 5.0 | 3.0 |
|  | (iii)-6 | 0.1 |  |  |
| Comp. Ex. 1 | (ii)-3 | 0.1 | 0 | — |
| Comp. Ex. 2 | (ii)-6 | 0.1 | 0 | — |
| Comp. Ex. 3 | (ii)-7 | 0.1 | 0 | — |
| Comp. Ex. 4 | (iii)-1 | 0.05 | 0 | — |
| Comp. Ex. 5 | (iii)-2 | 0.2 | 0 | — |
| Comp. Ex. 6 | (iii)-3 | 0.4 | 0 | — |
| Comp. Ex. 7 | (iii)-4 | 0.1 | 0 | — |
| Comp. Ex. 8 | (iii)-5 | 0.2 | 0 | — |
| Comp. Ex. 9 | (iii)-6 | 0.1 | 0 | — |
| Comp. Ex. 10 | (iii)-4 | 0.1 | 0 | — |
|  | (iii)-5 | 0.2 |  |  |
| Ex. 9 | (ii)-3 | 0.1 | 11.0 | 0.35 |
|  | (iii)-1 | 0.05 |  |  |
|  | (iv)-4 | 0.2 |  |  |
| Ex. 10 | (ii)-6 | 0.1 | 10.8 | 0.40 |
|  | (iii)-1 | 0.05 |  |  |
|  | (iv)-4 | 0.2 |  |  |
| Ex. 11 | (ii)-3 | 0.1 | 10.0 | 0.50 |
|  | (iii)-2 | 0.2 |  |  |
|  | (iv)-4 | 0.2 |  |  |
| Ex. 12 | (ii)-3 | 0.1 | 12.5 | 0.20 |
|  | (iii)-3 | 0.4 |  |  |
|  | (iv)-4 | 0.2 |  |  |
| Ex. 13 | (ii)-3 | 0.1 | 12.1 | 0.25 |
|  | (iii)-1 | 0.05 |  |  |
|  | (iv)-8 | 0.2 |  |  |
| Ex. 14 | (ii)-6 | 0.1 | 12.0 | 0.26 |
|  | (iii)-1 | 0.05 |  |  |
|  | (iv)-8 | 0.2 |  |  |
| Ex. 15 | (ii)-3 | 0.1 | 12.1 | 0.25 |
|  | (iii)-1 | 0.05 |  |  |
|  | (iv)-4 | 0.2 |  |  |
|  | (v)-8 | 0.4 |  |  |
| Ex. 16 | (ii)-3 | 0.1 | 13.2 | 0.14 |
|  | (iii)-1 | 0.05 |  |  |
|  | (iv)-8 | 0.2 |  |  |
|  | (v)-8 | 0.4 |  |  |
| Comp. Ex. 11 | (iv)-4 | 0.2 | 0 | — |
| Comp. Ex. 12 | (iv)-8 | 0.2 | 0 | — |
| Comp. Ex. 13 | (iv)-4 | 0.2 | 0 | — |
|  | (iii)-1 | 0.05 |  |  |
| Comp. Ex. 14 | (iv)-8 | 0.2 | 0 | — |
|  | (iii)-1 | 0.05 |  |  |
| Comp. Ex. 15 | (iv)-4 | 0.2 | 0 | — |
|  | (iii)-1 | 0.05 |  |  |
|  | (v)-8 | 0.4 |  |  |
| Comp. Ex. 16 | (iv)-8 | 0.2 | 0 | — |
|  | (iii)-1 | 0.05 |  |  |

TABLE 1-continued

| Example No. | Photo-polymerization Initiator System (g) | Number of Steps Cleared With Visible Light | Sensitivity With Argon Laser Beam (mJ/cm²) |
|---|---|---|---|
| | (v)-8 | | 0.4 |

It can be seen from the results of Table 1 that the photopolymerizable compositions according to the present invention which contain components (ii) and (iii) exhibit high sensitivity. It is also apparent that incorporation of components (iv) and/or (v) to the composition brings about a further increase of sensitivity.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising (i) a polymerizable compound having an addition polymerizable unsaturated bond, (ii) at least one compound selected from the group of compounds consisting of those represented by formulae (Ia), (Ib) and (Ic):

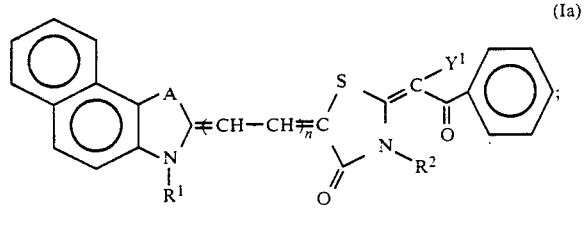

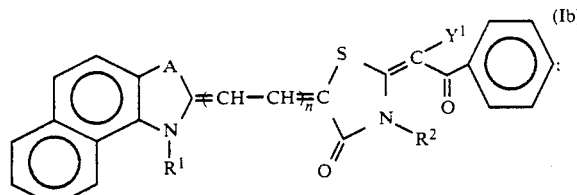

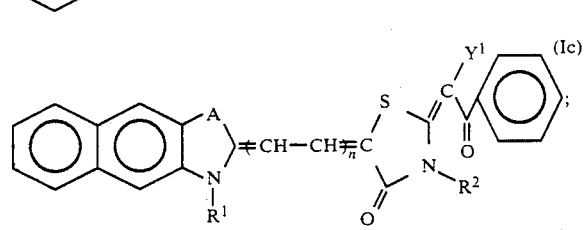

wherein A is an oxygen atom, a sulfur atom, a selenium atom, a tellurium atom, an alkyl- or aryl-substituted nitrogen atom, or a dialkyl-substituted carbon atom; $Y^1$ is a hydrogen atom, alkyl group, aryl group, an aralkyl group, an acyl group, or alkoxycarbonyl group; $R^1$ and $R^2$ each is a hydrogen atom, an alkyl group having from 1 to 18 carbon atoms, or an alkyl group having from 1 to 18 carbon atoms which is substituted with $R^3O-$,

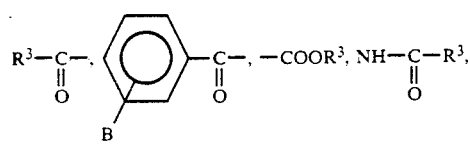

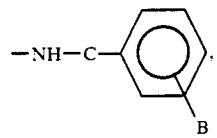

$(CH_2CH_2-O-)_m R^3$, or a halogen atom, wherein $R^3$ is a hydrogen atom or an alkyl group having from 1 to 10 carbon atoms, and B represents a dialkylamino group, a hydroxyl group, an acyloxy group, a halogen atom, or a nitro group; n is 0 or an integer of from 1 to 4; and m is an integer of from 1 to 20, and (iii) at least one compound selected from the group consisting of (a) a compound having a carbon-halogen bond, (b) an aromatic onium salt, (c) an organic peroxide, (d) a thio compound represented by formula (II):

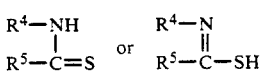

wherein $R^4$ is an alkyl group, or an aryl group; and $R^5$ is a hydrogen atom or an alkyl group; or $R^4$ and $R^5$ taken together are non-metallic atom groups of a 5- to 7-membered carbocyclic or heterocyclic ring, wherein the hetero atom is an oxygen, sulfur or nitrogen atom, (e) a hexaarylbiimidazole, and (f) a ketoxime ester.

2. A photopolymerizable composition as claimed in claim 1, wherein said composition further comprises (iv) a compound represented by formula (III):

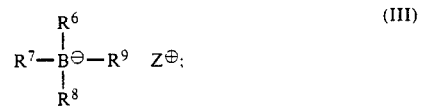

wherein $R^6$, $R^7$, $R^8$, and $R^9$, which may be the same or different, are each an alkyl group, an aryl group, an alkenyl group, an alkynyl group, or a heterocyclic group, or a heterocyclic group; or two or more of $R^6 R^7$, $R^8$, and $R^9$ taken together form a cyclic structure, with the proviso that at least one of $R^6$, $R^7$, $R^8$, and $R^9$ is an alkyl group; and $Z^\oplus$ represents an alkali metal cation or a quaternary ammonium cation.

3. A photopolymerizable composition as claimed in claim 1, wherein said composition further comprises (v) a compound represented by formula (IV):

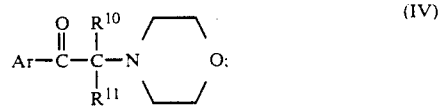

wherein Ar is an aromatic group represented by the formula:

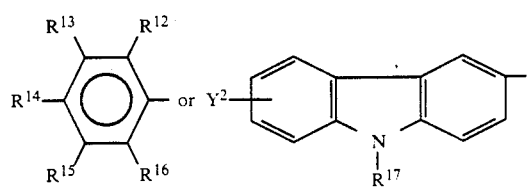

wherein $R^{12}$, $R^{13}$, $R^{14}$, $R^{15}$, and $R^{16}$, which may be the same or different, are each a hydrogen atom, a halogen atom, an alkyl group, an alkenyl group, an aryl group, a hydroxyl group, an alkoxyl group, —S—$R^{18}$, or —$SO_2R^{18}$, wherein $R^{18}$ is an alkyl group or an alkenyl group, with the proviso that at least one of $R^{12}$, $R^{13}$, $R^{14}$, $R^{15}$, and $R^{16}$ is —S—$R^{18}$, —SO—$R^{18}$, or —$SO_2R^{18}$; $R^{17}$ is a hydrogen atom, an alkyl group, or an acyl group; and $Y^2$ represents a hydrogen atom or

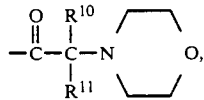

wherein $R^{10}$ and $R^{11}$ each represents a hydrogen atom or an alkyl group, or $R^{10}$ and $R^{11}$ taken together form an alkylene group.

4. A photopolymerizable composition as claimed in claim 1, wherein said photopolymerizable compound having an addition polymerizable unsaturated bond is at least one member selected from the group consisting of esters of unsaturated carboxylic acids and aliphatic polyhydric alcohols, and amides of unsaturated carboxylic acids and aliphatic polyamine compounds.

5. A photopolymerizable composition as claimed in claim 1, wherein said compound having a carbon-halogen bond is at least one member selected from the group consisting of compounds represented by formulae (V) to (XI):

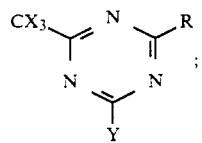

wherein X is a halogen atom; Y is —$CX_3$, —$NH_2$, —NHR', —$NR'_2$, or —OR', wherein R' is an alkyl group, or aryl group; and R represents —$CX_3$, an alkyl group, an aryl group, or a substituted alkenyl group;

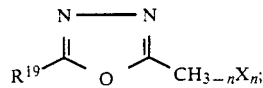

wherein $R^{19}$ is an alkyl group, alkenyl group, allyl group, aryl group, a halogen atom, alkoxyl group, a nitro group, or a cyano group, X is a halogen atom, and n is an inter of from 1 to 3;

$$R^{20}-Z-CH_{2-m}X_m-R^{21} \quad (VII);$$

wherein $R^{20}$ is an aryl group; $R^{21}$ is

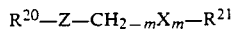

or a halogen atom; Z is

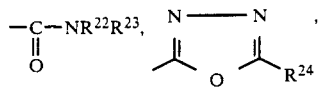

or —$SO_2$, $R^{22}$ and $R^{23}$ are each an alkyl group, alkenyl group, allyl group, or aryl group, $R^{24}$ has the same meaning as R' of formula (V), X is a halogen atom, and m is 1 or 2;

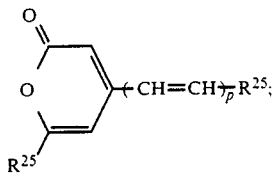

wherein $R^{25}$ is an aryl group or heterocyclic group; $R^{25}$ is a trihaloalkyl group or a trihaloalkenyl group each having from 1 to 3 carbon atoms, and p is 1, 2, or 3;

Carbonylmethylene heterocyclic compounds having a trihalogenomethyl group of formula:

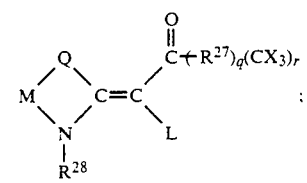

wherein L is a hydrogen atom or —CO—$(R^{27})_n(CX_3)_m$; M is an alkylene group; Q is a sulfur atom, a selenium atom, an oxygen atom, a dialkylmethylene group, an alken-1,2-ylene group, a 1,2-phenylene group, or N—$R^{28}$; M and Q taken together form a 3- or 4- membered ring; $R^{28}$ is an alkyl group, an aralkyl group, or an alkoxyalkyl group; $R^{27}$ is a carbocyclic or heterocyclic aromatic ring; X is a chlorine atom, a bromine atom, or an iodine atom; q is o and r is 1, or q is 1 and r is 1 or 2;

4-Halogeno-5-(halogenomethylphenyl)-oxazole derivatives of the formula

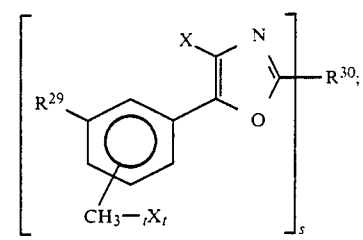

wherein X is a halogen atom; t is an integer of from 1 to 3; s is an integer of from 1 to 4; $R^{29}$ is a hydrogen atom or $CH_{3-+}X+$; and $R^{30}$ is a s-valent unsaturated organic group; and 2-(Halogenomethylphenyl)-4-halogeno-oxazole derivative of the formula:

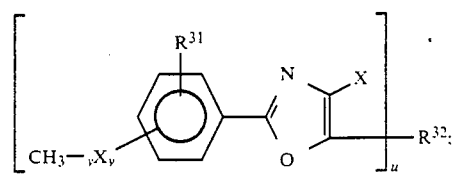

wherein X is a halogen atom; v is an integer of from 1 to 3; u is an integer of from 1 to 4; $R^{31}$ is a hydrogen atom or $CH_{3\nu}X_\nu$; and $R^{32}$ is a u-valent unsaturated organic group.
6. A photopolymerizable composition as claimed in claim 1, wherein said aromatic onium salt is an aromatic onium salt of N, P, As, Sb, Bi, O, S, Se, Te or I.
7. A photopolymerizable composition as claimed in in claim 1, wherein said aromatic onium salt is
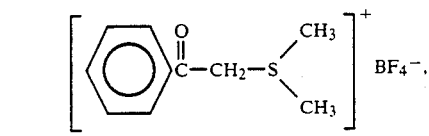
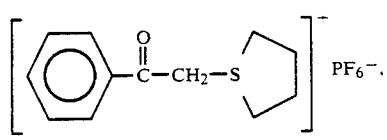
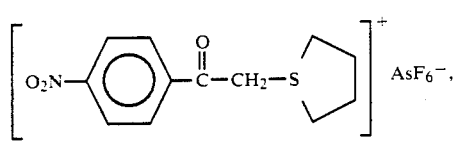
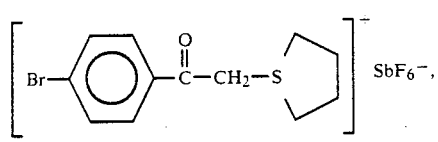
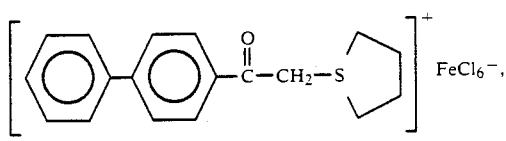
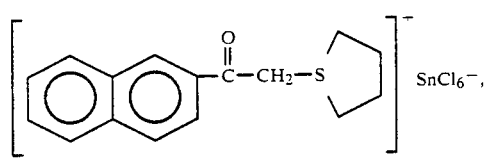
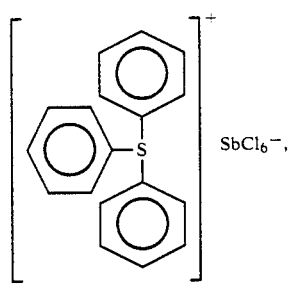
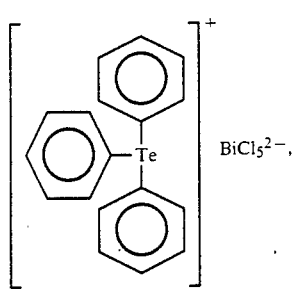
-continued
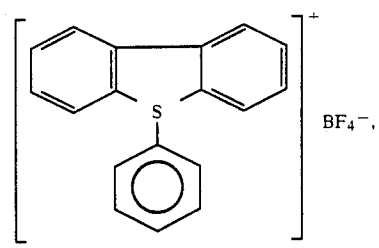
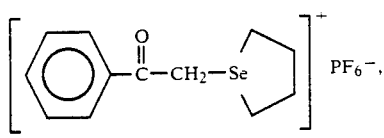
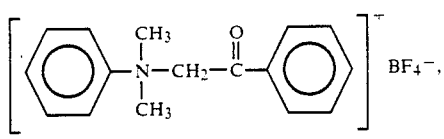
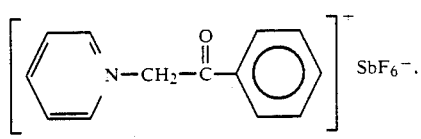
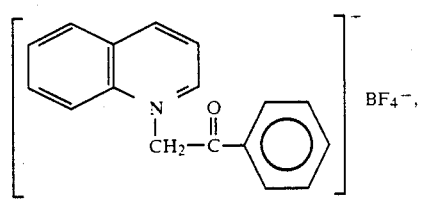
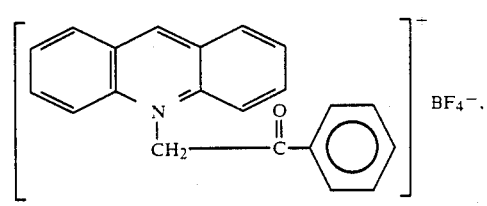
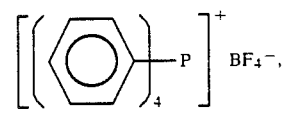
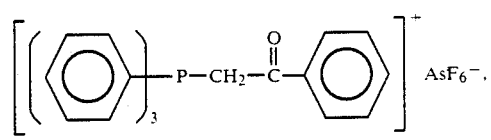
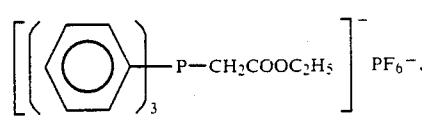

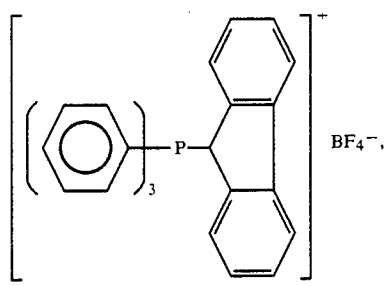

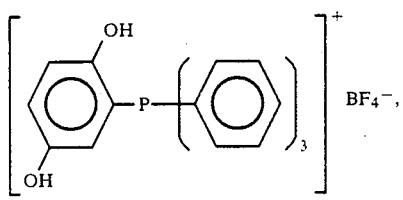

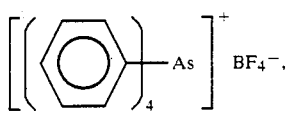

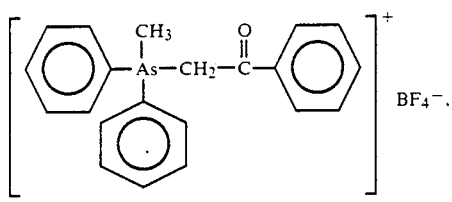

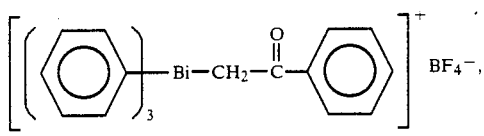

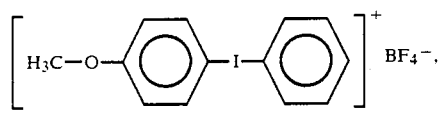

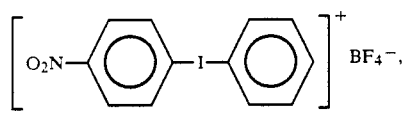

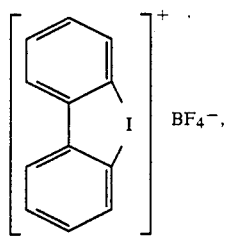

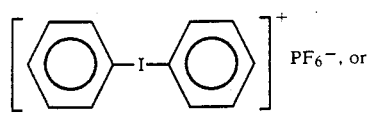

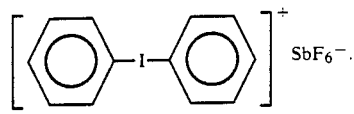

8. A photopolymerizable composition as claimed in claim 1, wherein said hexaarylbiimidazole is 2,2'-bis(o-chlorophenyl)-4,4',5,5'-tetraphenylbiimidazole, 2,2'-bis-(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, or 2,2'-bis(o-trifluoromethylphenyl)-4,4',5,5'-tetraphenylbiimidazole.

9. A photopolymerizable composition as claimed in claim 2, wherein said compound represented by formula (III)

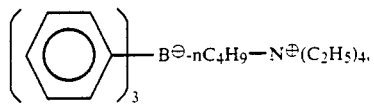

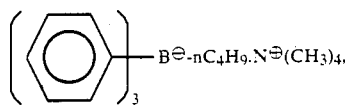

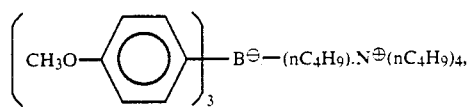

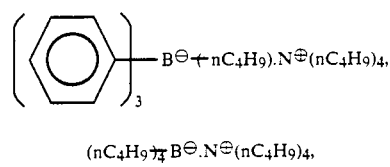

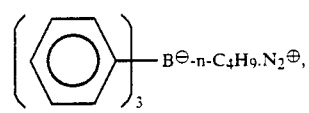

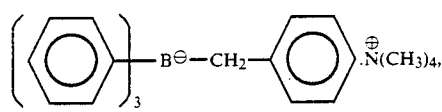

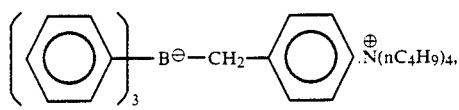

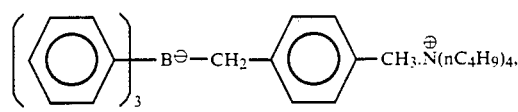

-continued

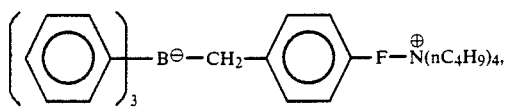

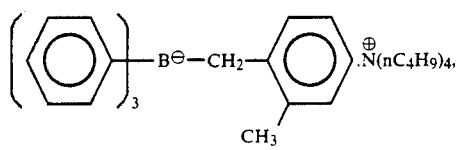

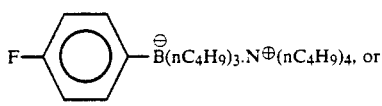

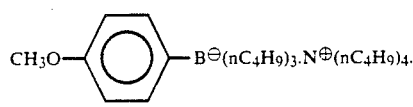

10. A photopolymerizable composition as claimed in claim 1, wherein said composition further comprises a film-forming linear organic high polymer.

11. A photopolymerizable composition as claimed in claim 10, wherein said high polymer is soluble in or swellable with water or weakly alkaline water.

12. A photopolymerizable composition as claimed in claim 1, wherein said composition comprises polymerizable compound (i) in an amount of from 5 to 50% by weight based on the total weight of the composition.

13. A photopolymerizable composition as claimed in claim 1, wherein said composition comprises compounds (ii) and (iii) in an amount of from 0.01 to 60% by weight based on the weight of polymerizable compound (i), with the weight ratio of compound (iii) to compound (ii) being in a range of from 0.05 to 30.

14. A photopolymerizable composition as claimed in claim 1, wherein said composition comprises compounds (ii) and (iii) in an amount of from 1 to 30% by weight based on the weight of polymerizable compound (i), with the weight ratio of compound (iii) to compound (ii) being in a range of from 0.2 to 5.

15. A photopolymerizable composition as claimed in claim 2, wherein said composition comprises the compound represented by the formula (iii) in an amount of from 0.02 to 20 parts by weight per part by weight of the compound (ii).

16. A photopolymerizable composition as claimed in claim 3, wherein said composition comprises the compound represented by the formula (IV) in an amount of from 0.01 to 50 parts by weight per part by weight of compound (ii).

17. A photopolymerizable composition as claimed in claim 10, wherein said composition comprises the film-forming linear organic high polymer in an amount of from 30 to 85% by weight based on the total weight of the composition.

18. A photopolymerizable composition according to claim 1, wherein compound (ii) is represented by formula (Ia) wherein $Y^1$ is a hydrogen atom, an unsubstituted straight chain or branched chain alkyl group having 1 to 4 carbon atoms or an acyl group, $R^1$ and $R^2$ are each an unsubstituted alkyl group having from 1 to 18 carbon atoms, A represents a sulfur atom, and n is 0.

19. A photopolymerizable composition according to claim 18, wherein component (iii) is a compound represented by formula (V):

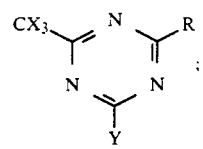

wherein X is a halogen atom; Y is $-CX_3$, $-NH_2$, $-NHR'$, $-NR'_2$, or $-OR'$, wherein R' is an alkyl group or an aryl group; and R is $-CX_3$, an alkyl group, an aryl group, or a substituted alkenyl group.

20. A photopolymerizable composition according to claim 19, wherein said composition represented by formula (V) is selected from the group consisting of 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2(2',4'-dichlorophenyl)-4,6-bis(trichloromethyl)-striazine, 2,4,6-tris(trichloromethyl)-s-triazine, 2-methyl-4,6-bis(-trichloromethyl)-s-triazine, 2-n-nonyl-4,6-bis(trichloromethyl-s-triazine, 2-($\alpha,\alpha,\beta$-trichloroethyl)-4,6-bis(trichloromethyl)-s-triazine, 2-stryryl-4,6-bis(trichloromethyl)-s-triazine, 2-(p-methylstyryle)-4,6-bis(-trichloromethyl)-s-triazine, 2-(p-methoxystyryl)-4,6-bis(trichloromethyl)-s-triazine, 2-(p-methoxystyryl)-4-amino-6-trichloromethyl-s-triazine, 2-(4-methoxynaphtho-1-yl)-4,6-bis(trichloromethyl)-s-triazine, 2,4-ethoxynaphtho-1-yl)-4,6-bis(trichloremethyl)-s-triazine,2-[4-(2-ethoxyethyl)-naptho-1yl]-4,6-bis (trichloromethyl)-s-triazine, 2-(4,7-dimethoxynaphtho-1yl)-4,6-bis(trichloromethyl)-s-triazine, and 2-(acenaphtho-5yl)-4,6-bis(trichloromethyl)-s-triazine,

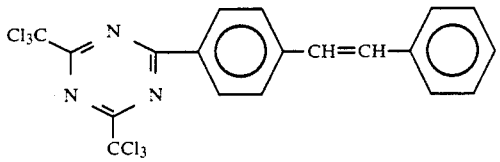

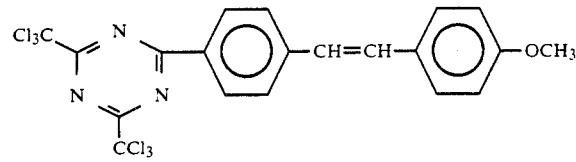

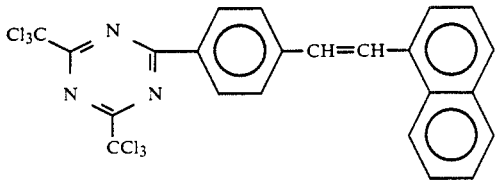

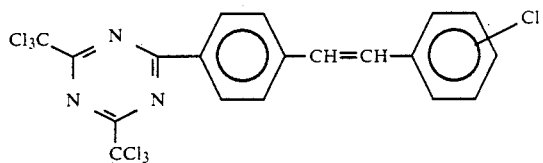

-continued

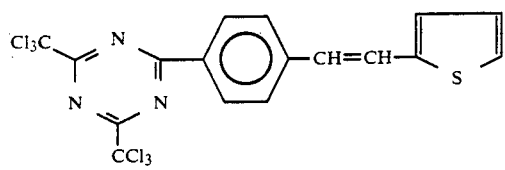

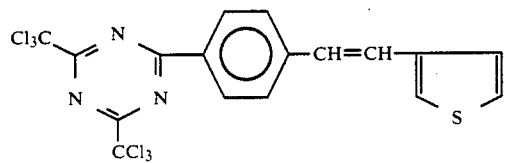

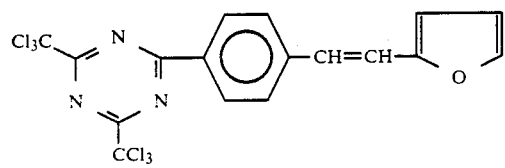

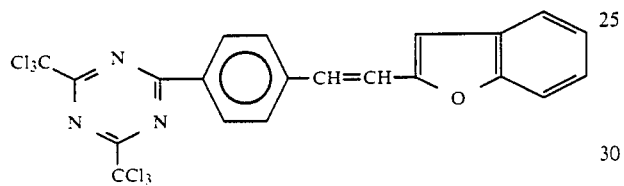

21. A photopolymerizable composition according to claim 19, wherein said composition further comprises (iv) a compound represented by formula (III):

$$R^7-\underset{\underset{R^8}{|}}{\overset{\overset{R^6}{|}}{B^{\ominus}}}-R^9 \quad Z^{\oplus};\qquad(III)$$

wherein $R^6$, $R^7$, $R^8$, and $R^9$, which may be the same or different, are each an alkyl group, an aryl group, an alkenyl group, an alkynyl group, or a heterocyclic group; or two or more of $R^6$, $R^7$, $R^8$, and $R^9$ taken together form a cyclic structure, with the proviso that at least one of $R^6$, $R^7$, $R^8$, and $R^9$ is an alkyl group; and $Z^{\oplus}$ is an alkali metal cation or a quaternary ammonium cation.

22. A photopolymerizable composition according to claim 21, wherein said compound represented by formula (III) is:

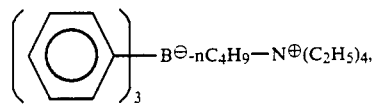

-continued

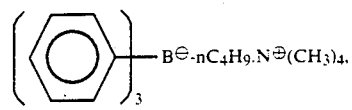

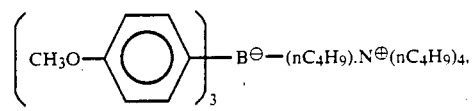

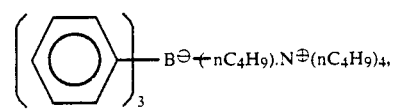

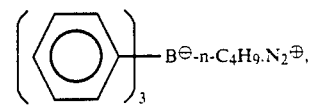

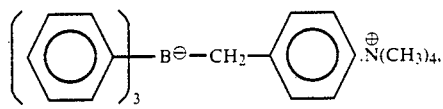

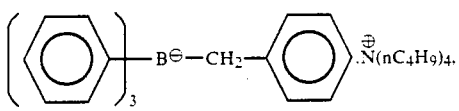

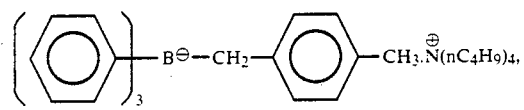

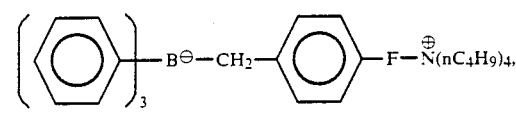

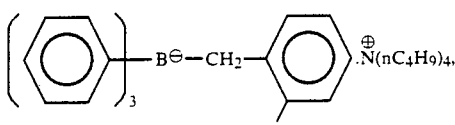

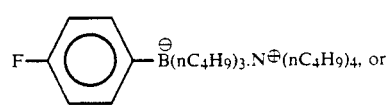

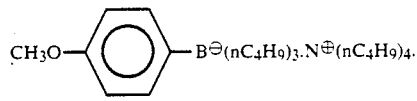

* * * * *